(12) United States Patent
Keser et al.

(10) Patent No.: US 9,379,065 B2
(45) Date of Patent: Jun. 28, 2016

(54) CRACK STOPPING STRUCTURE IN WAFER LEVEL PACKAGING (WLP)

(71) Applicant: QUALCOMM Incorporated, San Diego, CA (US)

(72) Inventors: Lizabeth Ann Keser, San Diego, CA (US); Zhongping Bao, San Diego, CA (US); Reynante Tamunan Alvarado, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 201 days.

(21) Appl. No.: 13/969,436

(22) Filed: Aug. 16, 2013

(65) Prior Publication Data

US 2015/0048517 A1 Feb. 19, 2015

(51) Int. Cl.
| | |
|---|---|
| H01L 21/00 | (2006.01) |
| H01L 23/00 | (2006.01) |
| H01L 23/58 | (2006.01) |
| H01L 23/528 | (2006.01) |
| H01L 23/31 | (2006.01) |
| H01L 23/525 | (2006.01) |

(52) U.S. Cl.
CPC .......... H01L 23/562 (2013.01); H01L 23/5283 (2013.01); H01L 23/585 (2013.01); H01L 24/02 (2013.01); H01L 24/05 (2013.01); H01L 24/06 (2013.01); H01L 24/27 (2013.01); H01L 24/29 (2013.01); *H01L 23/3114* (2013.01); *H01L 23/525* (2013.01); *H01L 24/03* (2013.01); *H01L 24/11* (2013.01); *H01L 24/13* (2013.01); *H01L 24/94* (2013.01); *H01L 2224/024* (2013.01); *H01L 2224/0231* (2013.01); *H01L 2224/0239* (2013.01); *H01L 2224/02235* (2013.01); *H01L 2224/02375* (2013.01); *H01L 2224/0401* (2013.01); *H01L 2224/05569* (2013.01); *H01L 2224/05572* (2013.01); *H01L 2224/05647* (2013.01); *H01L 2224/06179* (2013.01); *H01L 2224/131* (2013.01); *H01L 2224/13007* (2013.01); *H01L 2224/13022* (2013.01); *H01L 2224/13024* (2013.01); *H01L 2224/94* (2013.01); *H01L 2924/12042* (2013.01); *H01L 2924/15788* (2013.01); *H01L 2924/351* (2013.01)

(58) Field of Classification Search
CPC ..... H01L 23/562; H01L 23/585; H01L 24/11; H01L 24/13; H01L 24/29
See application file for complete search history.

(56) References Cited

U.S. PATENT DOCUMENTS

| | | |
|---|---|---|
| 5,849,606 A | 12/1998 | Kikuchi et al. |
| 7,049,701 B2 | 5/2006 | Usui |

(Continued)

*Primary Examiner* — Laura Menz
(74) *Attorney, Agent, or Firm* — Loza & Loza, LLP

(57) ABSTRACT

Some implementations provide a semiconductor device (e.g., die, wafer) that includes a substrate, metal layers and dielectric layers coupled to the substrate, a pad coupled to one of the several metal layers, a first metal redistribution layer coupled to the pad, an under bump metallization (UBM) layer coupled to the first metal redistribution layer. The semiconductor device includes several crack stopping structures configured to surround a bump area of the semiconductor device and a pad area of the semiconductor device. The bump area includes the UBM layer. The pad area includes the pad. In some implementations, at least one crack stopping structure includes a first metal layer and a first via. In some implementations, at least one crack stopping structure further includes a second metal layer, a second via, and a third metal layer. In some implementations, at least one crack stopping structure is an inverted pyramid crack stopping structure.

24 Claims, 21 Drawing Sheets

(56) References Cited

U.S. PATENT DOCUMENTS

| | | |
|---|---|---|
| 7,057,296 B2 | 6/2006 | Hung et al. |
| 7,919,833 B2 * | 4/2011 | Park .................... H01L 23/3185 |
| | | 257/620 |
| 8,022,509 B2 | 9/2011 | Jao |
| 8,039,367 B2 | 10/2011 | Wu |
| 2013/0320522 A1 * | 12/2013 | Lai ......................... H01L 24/05 |
| | | 257/737 |

* cited by examiner

CRACK STOPPING STRUCTURE IN WAFER LEVEL PACKAGING (WLP)

BACKGROUND

1. Field

Various features relate to a crack stopping structure in wafer level packaging (WLP).

2. Background

A typical die is manufactured by depositing several metal layers and several dielectric layers on top of a substrate. The die is manufactured by using a wafer level packaging (WLP) process. The substrate, metal layers and dielectric layers are what form the circuit elements of the die. Multiple dies are usually manufactured on a wafer. FIG. 1 illustrates a plan view of a wafer 100 that includes several uncut dies 102. Each uncut die includes a substrate, metal layers and dielectric layers. The wafer 100 is then cut into individual/single dies. FIG. 1 also illustrates vertical and horizontal scribe lines 102-104. Scribe lines are portions of the wafer 100 that are cut in order to manufacture the individual dies (e.g., die 102).

FIG. 2 illustrates a side view of a wafer. Specifically, FIG. 2 illustrates a side view of a portion of a wafer 200. The wafer 200 includes several metal and dielectric layers 202, a pad 204, a passivation layer 206, a first insulation layer 208, a first metal layer 210, a second insulation layer 212, and an under bump metallization (UBM) layer 214. FIG. 2 also illustrates a solder ball 216 on the wafer 200. Specifically, the solder ball 216 is coupled to the UBM layer 214. The pad 204, the first metal layer 210 and the UBM layer 214 are a conductive material (e.g., copper). The first insulation layer 208 and the second insulation layer 212 are polyimide layers (PI), Polybenzoxazole (PBO) or other polymer layers used for repassivation. FIG. 2 also illustrates a region of the wafer 200 that will be cut to create individual dies. This region of the wafer 200 is illustrated by the scribe line 218, which may correspond to either of the scribe lines 104-106 of FIG. 1.

During the process of cutting the wafer (e.g., wafers 100, 200) into one or more dies, a lot of stress (e.g., thermal stress, mechanical stress) is applied to the die. The resulting stress on the die may affects components of the die and/or the package, including the metal layers, the dielectric layers, the passivation layer, the UBM layer, and/or the solder balls.

In addition, a die and/or wafer level package (WLP) may be subject to stress (e.g., thermal stress, mechanical stress) during (1) the process of attaching the die and/or WLP to a printed circuit board (PCB), (2) a temperature reliability test, (3) the field life span of the die, and/or (4) during drop/shock/bending events. For example, during a chip/die attach process to a PCB (where the temperature goes from ~25 C. to ~230 C. then to ~25 C. again in some instances), different components will expand and shrink at different rates because different components have different coefficient of thermal expansion (CTE). For instance, the die and/or WLP (which is made of silicon) has a CTE of about 2.7 ppm, while the PCB has a CTE that is greater than 10 ppm (mostly about 17 ppm). Moreover, the die and/or WLP is coupled to the PCB by solder bump or Copper bump interconnects. The stress on the die (or WLP) comes from the difference in CTEs (CTE mismatch) between the die and the PCB and how they are coupled to each other. Furthermore, after the die and/or WLP is mounted onto the PCB, it will experience temperature swings as part of field conditions. This will cause stress on the dies as well. Moreover, during package development, there are specific board level reliability tests that a WLP must pass. For example, a WLP needs to pass a temperature cycling reliability test and a drop test. In device field condition, there will be drop or shock or bending events that will generate stress in dies. In all these scenarios, die corner areas will usually have the highest stress thus cracks may be generated from die corners first.

Therefore, there is a need for a design to stop and/or prevent the propagation of a crack and/or chipping of a die.

SUMMARY

Various features, apparatus and methods described herein provide a crack stopping structure in wafer level packaging (WLP).

A first example provides a semiconductor device (e.g., die, wafer) that includes a substrate, metal layers and dielectric layers coupled to the substrate, a pad coupled to one of the several metal layers, a first metal redistribution layer coupled to the pad, an under bump metallization (UBM) layer coupled to the first metal redistribution layer. The semiconductor device also includes several crack stopping structures configured to surround a bump area of the semiconductor device and a pad area of the semiconductor device. The bump area includes the UBM layer. The pad area includes the pad. In some implementations, at least one crack stopping structure includes a first metal layer and a first via.

According to an aspect, at least one crack stopping structure further includes a second metal layer, a second via, and a third metal layer.

According to one aspect, at least one crack stopping structure is an inverted pyramid crack stopping structure.

According to an aspect, at least one crack stopping structure completely surrounds the bump area and the pad area while providing a space for one or more metal interconnects to laterally traverse the crack stopping structure.

According to one aspect, the crack stopping structure is free of an electrical connection with a circuit element of the semiconductor device.

According to an aspect, at least crack stopping structure is configured to stop a crack from propagating in the semiconductor device.

According to one aspect, the semiconductor device is one of at least a die, a die package, an integrated circuit (IC), a wafer, and/or an interposer.

According to an aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus that includes a substrate, several metal layers and dielectric layers coupled to the substrate, a pad coupled to one of the several metal layers, a first metal redistribution layer coupled to the pad, an under bump metallization (UBM) layer coupled to the first metal redistribution layer, and a means for stopping crack from propagating in the apparatus. The means for stopping crack is configured to surround a bump area of the apparatus and a pad area of the apparatus. The bump area includes the UBM layer. The pad area includes the pad.

According to an aspect, the means for stopping crack includes a first metal layer and a first via. In some implementations, the means for stopping crack further includes a second metal layer, a second via, and a third metal layer.

According to one aspect, the means for stopping crack includes an inverted pyramid crack stopping structure.

According to an aspect, the means for stopping crack completely surrounds the bump area and the pad area while providing a space for one or more metal interconnects to laterally traverse the crack stopping structure.

According to one aspect, the means for stopping crack is free of an electrical connection with a circuit element of the apparatus.

According to an aspect, the apparatus is one of at least a die, a die package, an integrated circuit (IC), a wafer, and/or an interposer.

According to one aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for providing a semiconductor device. The method provides a substrate. The method also provides several metal layers and dielectric layers coupled to the substrate. The method further provides a pad coupled to one of the plurality of metal layers. The method provides a first metal redistribution layer coupled to the pad. The method provides an under bump metallization (UBM) layer coupled to the first metal redistribution layer. The method provides several crack stopping structures configured to surround a bump area of the semiconductor device and a pad area of the semiconductor device. The bump area includes the UBM layer. The pad area includes the pad. At least one crack stopping structure includes a first metal layer and a first via.

According to an aspect, the at least one crack stopping structure further includes a second metal layer, a second via, and a third metal layer.

According to one aspect, the at least one crack stopping structure is an inverted pyramid crack stopping structure.

According to an aspect, the at least one crack stopping structure completely surrounds the bump area and the pad area while providing a space for one or more metal interconnects to laterally traverse the crack stopping structure.

According to one aspect, the crack stopping structure is free of an electrical connection with a circuit element of the semiconductor device.

According to an aspect, the at least crack stopping structure is configured to stop a crack from propagating in the semiconductor device.

According to one aspect, the semiconductor device is one of at least a die, a die package, an integrated circuit (IC), a wafer, and/or an interposer.

According to an aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to a semiconductor device semiconductor device (e.g., die, wafer) that includes a substrate, metal layers and dielectric layers coupled to the substrate, a pad coupled to one of the several metal layers, a first metal redistribution layer coupled to the pad, an under bump metallization (UBM) layer coupled to the first metal redistribution layer. The semiconductor device also includes several crack stopping structures configured to surround a bump area of the semiconductor device and a pad area of the semiconductor device. The bump area includes the UBM layer. The pad area includes the pad. In some implementations, at least one crack stopping structure includes a first metal layer and a first via. In some implementations, at least one crack stopping structure further includes a second metal layer, a second via, and a third metal layer. In some implementations, at least one crack stopping structure is an inverted pyramid crack stopping structure. In some implementations, at least one crack stopping structure completely surrounds the bump area and the pad area while providing a space for one or more metal interconnects to laterally traverse the crack stopping structure. In some implementations, the crack stopping structure is free of an electrical connection with a circuit element of the semiconductor device. In some implementations, at least crack stopping structure is configured to stop a crack from propagating in the semiconductor device.

Exemplary Crack Stopping Structure in Semiconductor Device

Figure 1:
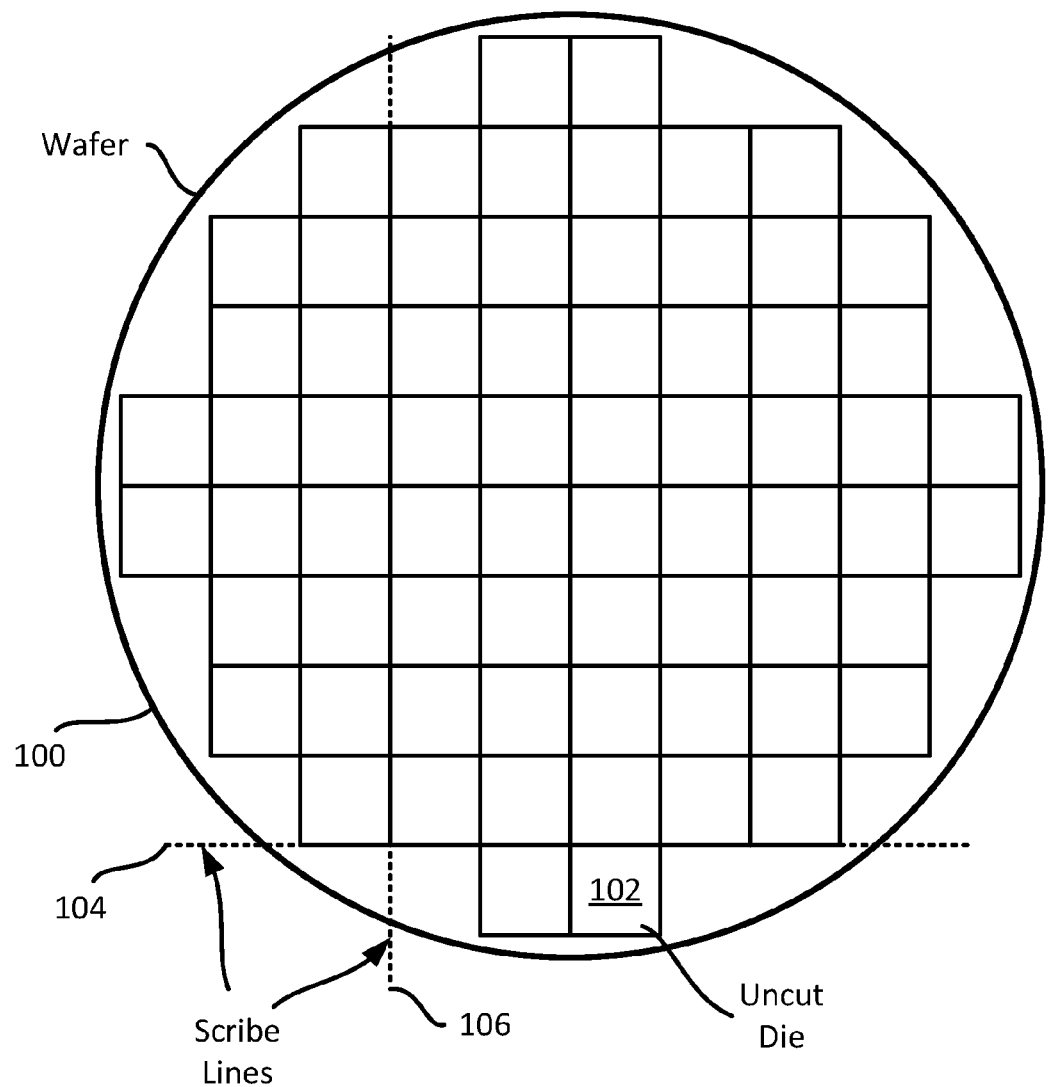
FIG. 1 illustrates a wafer that includes uncut dies.
Figure 2:
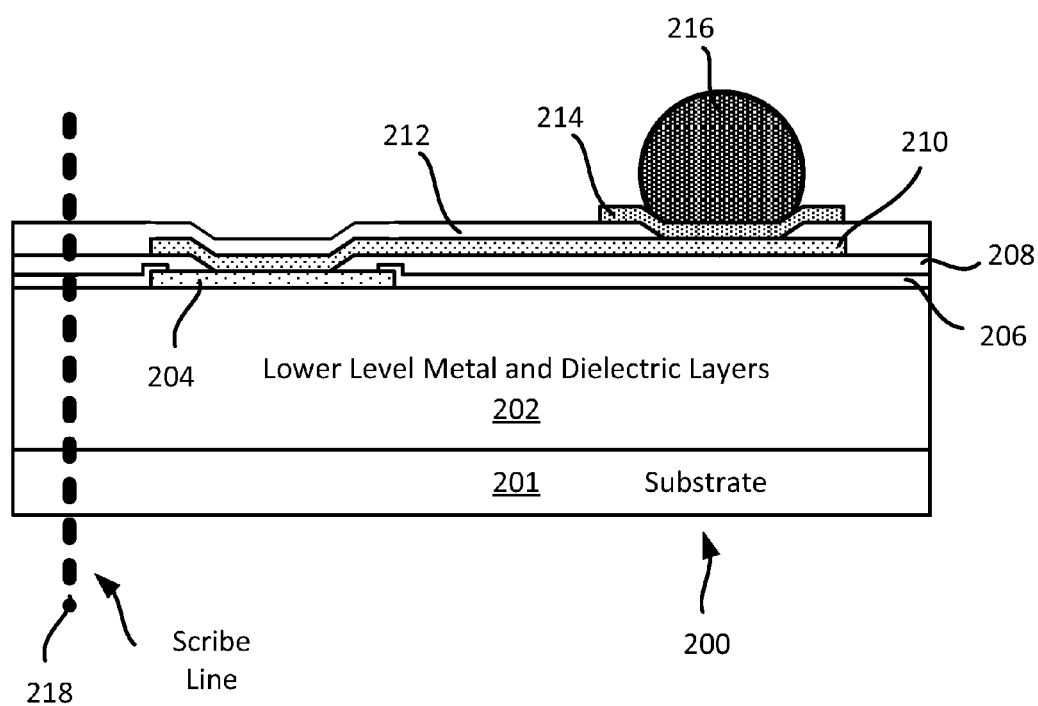
FIG. 2 illustrates a side view of a die.
Figure 3:
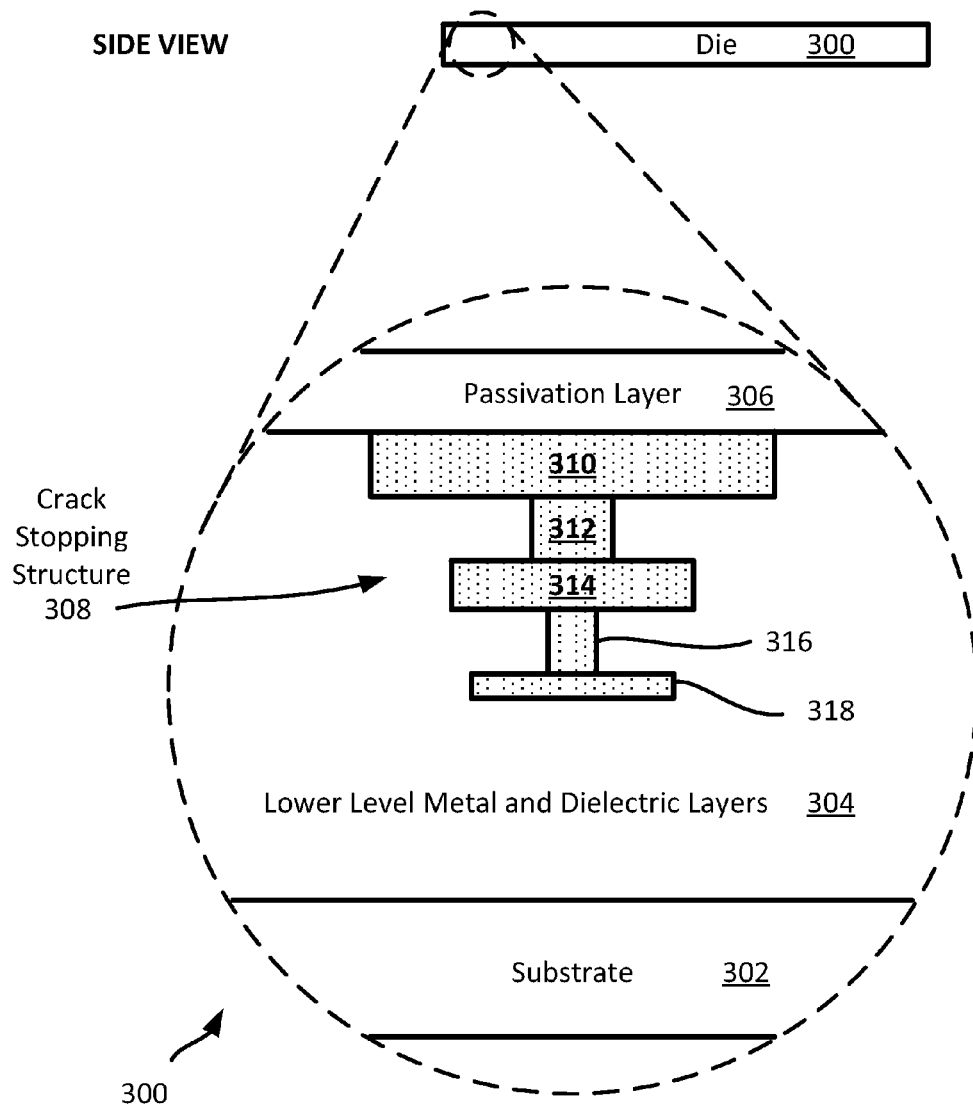
FIG. 3 illustrates an example of a die that includes a crack stopping structure.

FIG. 3 conceptually illustrates an example of a side view of a crack stopping structure in a die. Specifically, FIG. 3 illustrates a die 300 that includes a substrate 302, several lower level metal and dielectric layers 304, a passivation layer 306 and a crack stopping structure 308. As shown in FIG. 3, the crack stopping structure 308 is embedded in the lower level metal and dielectric layer 304. The crack stopping structure 308 includes a first metal layer 310, a first via 312, a second metal layer 314, a second via 316, and a third metal layer 318. In some implementations, the first metal layer 310 is located in a top metal layer (e.g., M5 metal layer) of the die 300. In some implementations, the first metal layer 310 is located directly beneath the passivation layer 306 of the die 300. The first metal layer 310 is coupled to the first via 312. In some implementations, the second via 312 is coupled to the second metal layer 314 (e.g., M4 metal layer). The second metal layer 314 is coupled to the second via 316. The second via 316 is coupled to the third metal layer 318 (e.g., M3 metal layer).

In some implementations, the crack stopping structure 308 is configured to minimize, prevent, and/or stop the spreading of a crack that may start from one or more corners of the die area and/or around an area (e.g., bump area) of the die where solder is coupled to the die. Unlike metal interconnects/routes in a die, which are configured to provide an electrical path/connection between active and/or passive elements of the die (e.g., circuits of the die), the crack stopping structure 308 does not provide an electrical path/connection for the die. In other words, the crack stopping structure is free of an electrical connection with a circuit element (e.g., passive and/or active component) of the die.

In some implementations, the crack stopping structure 308 is made of a material that improves/enhances the structural and mechanical stability of the wafer or the die. For example, a crack stopping structure may be made of a material (e.g., copper) that is less brittle than some of the low K (LK) dielectrics, extremely low K (ELK), or ultra low K (ULK) dielectrics in the wafer/die, which would provide the wafer/die with additional structure, rigidity and mechanical stability to absorb some of the stress (e.g., thermal stress, mechanical stress) that the wafer/die is subject to during the manufacturing of the die (e.g., during the cutting of the wafer into singular dies), during the process of attaching the die and/or WLP to a printed circuit board (PCB) (e.g., due to CTE mismatch), during a temperature reliability test, during the field life span of the die, and/or during drop/shock/bending events. Thus, including one or more crack stopping structures, which is less brittle than some or all of the dielectrics increases the amount of stress (e.g., thermal stress, mechanical stress) that wafer or die can absorb, thus decreasing the likelihood of the die cracking/chipping during the manufacturing of the die and/or wafer, during the process of attaching the die and/or WLP to a printed circuit board (PCB) (e.g., due to CTE mismatch), during a temperature reliability test, during the field life span of the die, and/or during drop/shock/bending events.

Figure 4:
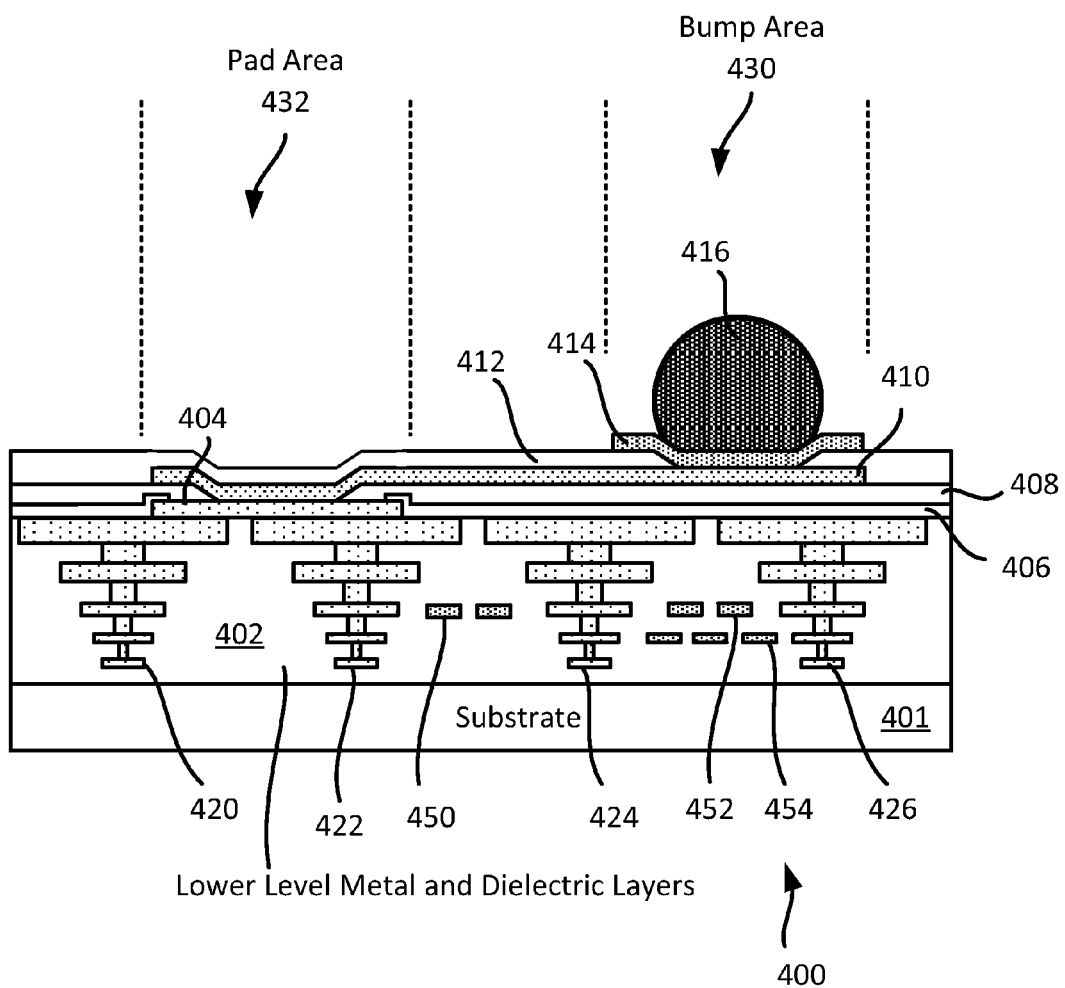
FIG. 4 illustrates an example of a die that includes a crack stopping structure.

FIG. 4 illustrates an example of a detailed side view of a semiconductor device (e.g., wafer and/or die) that includes several crack stopping structures that protect the semiconductor device (e.g., a die) from cracking/chipping. Specifically, FIG. 4 illustrates a side view of a portion of a semiconductor device 400 (e.g., die, wafer). The semiconductor device 400 includes a substrate 401, several lower level metal and dielectric layers 402, a pad 404, a passivation layer 406, a first insulation layer 408, a first metal redistribution layer 410, a second insulation layer 412, and an under bump metallization (UBM) layer 414.

FIG. 4 also illustrates a first crack stopping structure 420, a second crack stopping structure 422, a third crack stopping structure 424, and a fourth crack stopping structure 426. As shown in FIG. 4, the first, second, third and fourth crack stopping structure 420-426 are located in the lower level metal and dielectric layers 402. These crack stopping structures 420-426, as well as other examples of crack stopping structures will be further described in detail in FIGS. 5-13. It should be noted that some semiconductor devices may includes circuit elements, interconnects, and/or routes.

In some implementations, the space between the crack stopping structures (e.g., first crack stopping structure 420, a second crack stopping structure 422, a third crack stopping structure 424, and a fourth crack stopping structure 426) allows one or more metal interconnects/routes to laterally traverse the crack stopping structures. Thus, the crack stopping structures do not significantly block routes and/or interconnects in the semiconductor device (e.g., die). That is, the crack stopping structures are configured to prevent crack from propagating on the die (e.g., prevent cracks from propagating from corner of the die to a center of the die), while at the same time, the crack stopping structures are configured to allow routes and/or interconnects to traverse the crack stopping structures. As shown in FIG. 4, a first set of interconnects 450 (e.g., routes) may traverse between the second crack stopping structure 422 and the third crack stopping structure 424. FIG. 4 also illustrates a second set of interconnects 452 (e.g., routes) and a third set of interconnects 454 (e.g., routes) that traverse between the third crack stopping structure 424 and the fourth crack stopping structure 426. Thus, the crack stopping structures of FIG. 4, as well as the other crack stopping structures described in the present disclosure provide a novel method and structure for preventing cracks from propagating in a die and/or WLP without interfering with interconnects and/or routing in the die and/or WLP.

In some implementations, the crack stopping structures (e.g., first crack stopping structure 420, a second crack stopping structure 422, a third crack stopping structure 424, and a fourth crack stopping structure 426) are configured in such a way as to surround (e.g., completely surround, partially surround) a bump area and/or a pad area of a semiconductor device.

FIG. 4 also illustrates a solder ball 416 on the wafer 400. Specifically, the solder ball 416 is coupled to the UBM layer 414. The pad 404, the first metal redistribution layer 410 and the UBM layer 414 are a conductive material (e.g., copper). The first insulation layer 408 and the second insulation layer 412 may be polyimide layers. In some implementations, the first insulation layer 408 and the second insulation layer 412 may be Polybenzoxazole (PbO) layers and/or polymer layers.

FIG. 4 further illustrates a first bump area 430 and a first pad area 432. The first bump area 430 is an area of the semiconductor device 400 (e.g., die and/or wafer) that includes the UBM layer 414 and/or solder ball 416. The first pad area 432 is an area of the semiconductor device 400 (e.g., die and/or wafer) that includes the pad 404. In some implementations, the semiconductor device 400 may include several bump areas and several pad areas.

In some implementations, the first, second, third and/or fourth crack stopping structure 420-426 are configured and/or arranged in the semiconductor device 400 so that the first, second, third and/or fourth crack stopping structure 420-426 include the first bump area 430 and/or the first pad area 432. Examples of how one or more crack stopping structures may be laterally arranged and/or configured in the semiconductor device are further illustrated and described in FIGS. 9-10. However, before describing how crack stopping structures are laterally arranged and/or configured in a semiconductor device, several different examples of crack stopping structures are described.

Different implementations may use different configurations of a crack stopping structure. For example, some implementations of a crack stopping structure may use a different number of metal layers and/or via. FIGS. 5-8 illustrate examples of different crack stopping structures.

Figure 5:
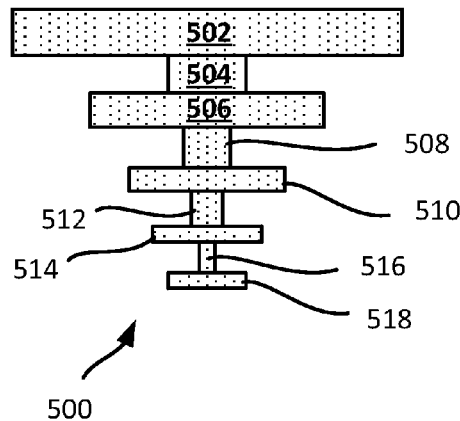
FIG. 5 illustrates an example of a crack stopping structure.

FIG. 5 illustrates a crack stopping structure in some implementations. As shown in FIG. 5, the crack stopping structure 500 includes a first metal layer 502 (e.g., M5 metal layer), a first via 504, a second metal layer 506 (e.g., M4 metal layer), a second via 508, a third metal layer 510 (e.g., M3 metal layer), a third via 512, a fourth metal layer 514 (e.g., M2 metal layer), a fourth via 516, and a fifth metal layer 518 (e.g., M1 metal layer). In some implementations, the crack stopping structure 500 has an inverted pyramid profile when implemented and/or integrated in the lower level metal and dielectric layers of a semiconductor device (e.g., die).

Figure 6:
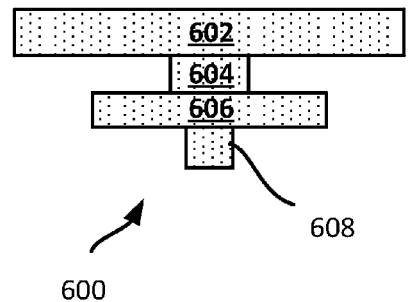
FIG. 6 illustrates another example of a crack stopping structure.

In some implementations, a crack stopping structure may include more than 5 metal layers. In some implementations, a crack stopping structure may include less than 5 metal layers. FIG. 6 illustrates another crack stopping structure 600 that includes two metal layers. As shown in FIG. 6, the crack stopping structure 600 includes a first metal layer 602 (e.g., M5 metal layer), a first via 604, a second metal layer 606 (e.g., M4 metal layer), and a second via 608. In some implementations, the crack stopping structure 600 has an inverted pyramid profile when implemented and/or integrated in the lower level metal and dielectric layers of a semiconductor device (e.g., die).

Figure 7:
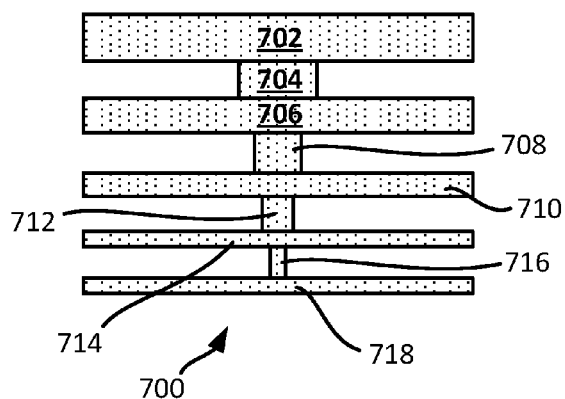
FIG. 7 illustrates another example of a crack stopping structure.

FIG. 7 illustrates another crack stopping structure in some implementations. As shown in FIG. 7, the crack stopping structure 700 includes a first metal layer 702 (e.g., M5), a first via 704, a second metal layer 706 (e.g., M4), a second via 708, a third metal layer 710 (e.g., M3), a third via 712, a fourth metal layer 714 (e.g., M2), a fourth via 716, and a fifth metal layer 718 (e.g., M1). In this example, the crack stopping structure 700 includes metal layers that have roughly the same width.

Figure 8:
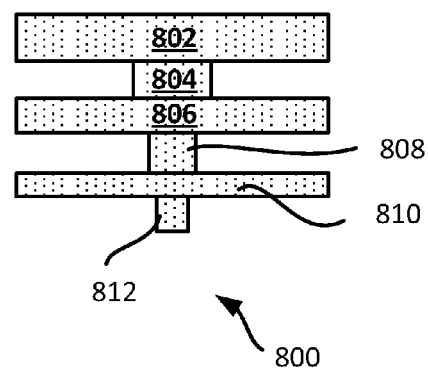
FIG. 8 illustrates another example of a crack stopping structure.

FIG. 8 illustrates another crack stopping structure 800 that includes three metal layers. As shown in FIG. 8, the crack stopping structure 800 includes a first metal layer 802 (e.g., M5), a first via 804, a second metal layer 806 (e.g., M4), a second via 808, a third metal layer 810 (e.g., M3), and a third via 812. In this example, the crack stopping structure 700 includes metal layers that have roughly the same width.

It should be noted that FIGS. 5-8 are merely examples of crack stopping structures. Other implementations may use crack stopping structures with different number of metal layers and/or vias. In addition, different implementations may include crack stopping structures that have metal layers with different thicknesses. Moreover, some implementations may include different combinations of crack stopping structures (e.g., a semiconductor device may include the crack stopping structure 500 and the crack stopping structure 600).

Figure 9A:
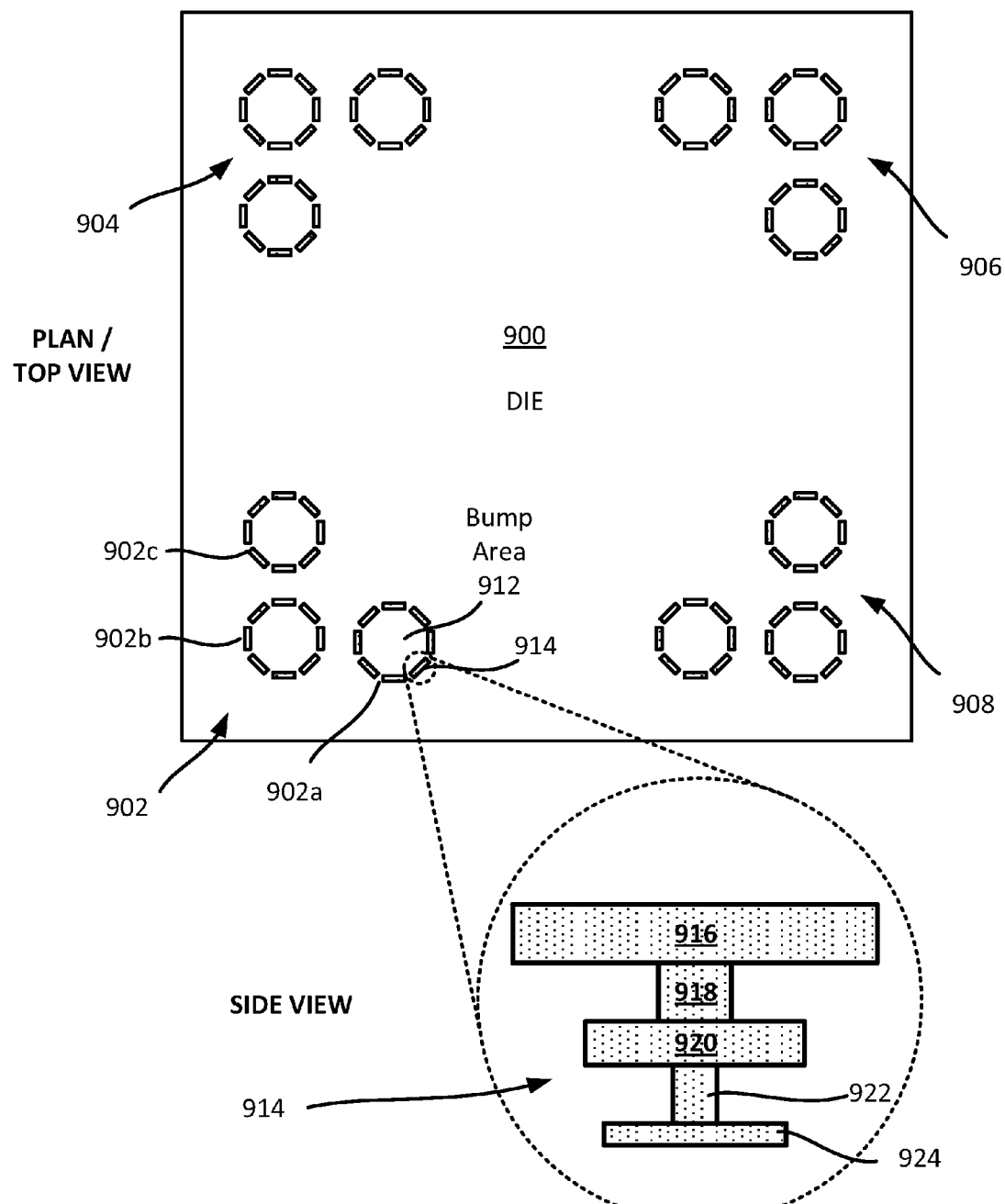
FIG. 9A illustrates an example of a die that includes a crack stopping structure.

FIG. 9A illustrates a plan view (e.g., top view) and a side of several crack stopping structures in a semiconductor device (e.g., die). Specifically, FIG. 9A illustrates a semiconductor device 900 (e.g., die, wafer) that includes a first set of crack stopping structure 902, a second set of crack stopping structures 904, a third set of crack stopping structures 906, and a third set of crack stopping structures 908. As shown in FIG. 9A, the set of crack stopping structures 902-908 are positioned near the corners of the semiconductor device 900 (e.g., die).

As described above, during the cutting/slicing/sawing process of a wafer into several dice, the area near the corners of the die is prone to cracking. Moreover, the die may be prone to cracking under other conditions as well. For example, a die and/or a wafer may be prone to cracking during the process of attaching the die and/or WLP to a printed circuit board (PCB) (e.g., due to CTE mismatch), during a temperature reliability test, during the field life span of the die, and/or during drop/shock/bending events. In particular, the area where solder is going to be coupled to the die (e.g., bump area) is prone to cracking (especially near corner of die and/or wafer). As such, one or more crack stopping structures are positioned near the corners of the die. Moreover, crack stopping structures are configured in the semiconductor device (e.g., die) in such a way as to surround (e.g., completely surround, partially surround) one or more bump areas of the semiconductor device (e.g., area of the die where a solder ball is going to be coupled to the die).

As shown in FIG. 9A, the first set of crack stopping structures 902 includes three crack stopping structures, including a first crack stopping structure 902a, a second crack stopping structure 902b, and a third crack stopping structure 902c. The crack stopping structure 902a is formed by several crack stopping structures.

In some implementations, the crack stopping structure 902a is configured in such a way as to surround the bump area 912 of the semiconductor device 900 (e.g., die). The bump area 912 is an area of the semiconductor device (e.g., die) near the corner, where a solder (not shown) is going to be coupled to the semiconductor device (e.g., during a bonding process that couples the die to a package substrate). In some implementations, the bump area 912 is the bump area 430 of FIG. 4.

As further shown in FIG. 9A, the crack stopping structure 902a is formed by several structures (e.g., structure 914) that surround the bump area 912. These structures (e.g., structure 914) may also be referred to as crack stopping structures. Each structure is formed by one or more metal layers and one or more vias integrated and/or implemented in the lower level metal and dielectric layers (e.g., lower level metal and dielectric layers 402) of the semiconductor device (e.g., semiconductor device 400). For example, the structure 914 includes a first metal layer 916, a first via 918, a second metal layer 920, a second via 922, and a third metal layer 924. In some implementations, the structure 914 of FIG. 9 is the same as the crack stopping structure 308 of FIG. 3. However, the structure 914 may be any of the crack stopping structures described in the present disclosure (e.g., crack stopping structures 420, 500, 600, 700, 800). In some implementations, the crack stopping structure may includes combinations of different types of crack stopping structures (e.g., (e.g., crack stopping structure 500 and crack stopping structure 600).

In some implementations, the space between the crack stopping structures allows one or more metal interconnects/ routes to laterally traverse the crack stopping structure. Thus, the crack stopping structure does not significantly block routes and/or interconnects in the semiconductor device (e.g., die).

As described above, crack stopping structures are configured in the semiconductor device (e.g., die) in such a way as to surround (e.g., completely surround, partially surround) one or more bump areas of the semiconductor device (e.g., area of the die where a solder ball or other interconnect material, such as a copper bump, is going to be coupled to the die). In some implementations, the crack stopping structures are configured in the semiconductor device in such a way as to partially surround one or more bumps areas of the semiconductor device.

Figure 9B:
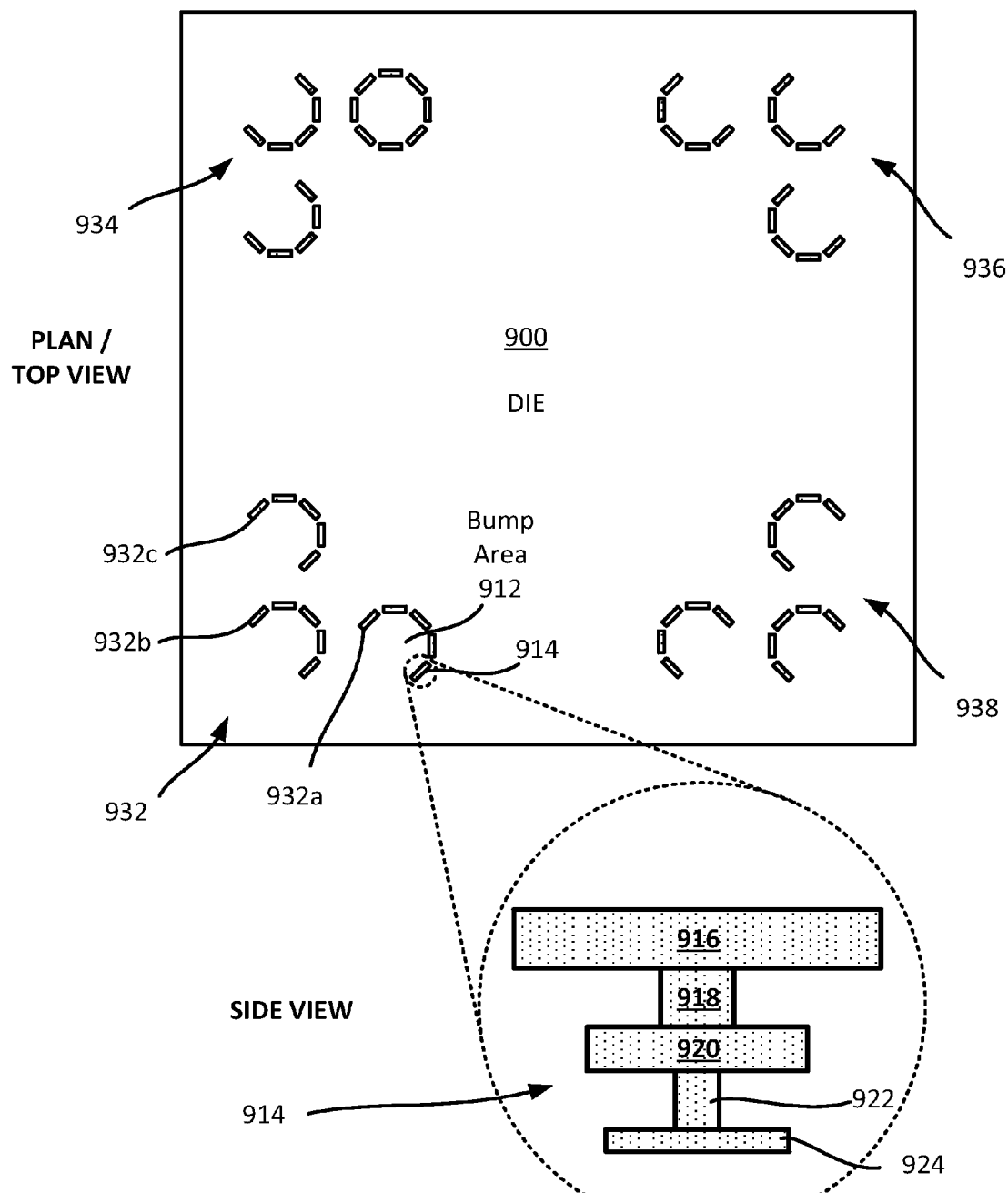
FIG. 9B illustrates another example of a die that includes a crack stopping structure.
Figure 9C:
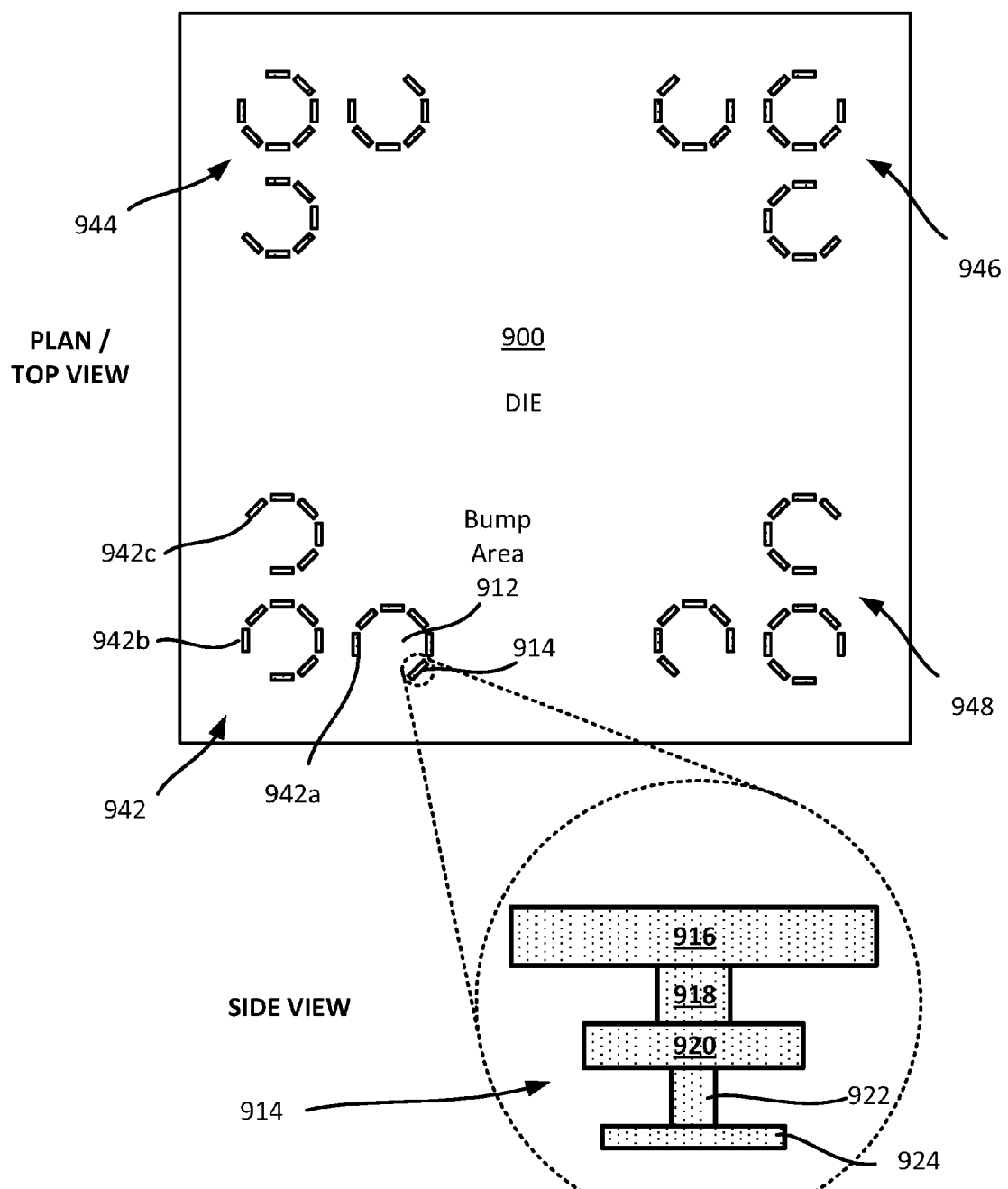
FIG. 9C illustrates another example of a die that includes a crack stopping structure.

FIGS. 9B and 9C illustrate plan views (e.g., top view) and a side of several crack stopping structures in a semiconductor device (e.g., die). FIG. 9B illustrates a semiconductor device 900 (e.g., die, wafer) that includes a first set of crack stopping structure 932, a second set of crack stopping structures 934, a third set of crack stopping structures 936, and a third set of crack stopping structures 938. Specifically, FIG. 9B illustrates crack stopping structures (e.g., a first set of crack stopping structure 932, a second set of crack stopping structures 934, a third set of crack stopping structures 936, and a third set of crack stopping structures 938) that partially surround (e.g., half circle) a bump area. In some implementations, each set of crack stopping structure is formed by the crack stopping structure 914, as described in FIG. 9A. However, different implementations may use any of the crack stopping structures described in the present disclosure. The crack stopping structure is positioned to be between the bump area and a center of the semiconductor device (e.g., die). In some implementations, the crack stopping structure helps prevents cracks from propagating towards the center of the die.

FIG. 9C illustrates a semiconductor device 900 (e.g., die, wafer) that includes a first set of crack stopping structure 942, a second set of crack stopping structures 944, a third set of crack stopping structures 946, and a third set of crack stopping structures 948. FIG. 9C illustrates crack stopping structures (e.g. a first set of crack stopping structure 942, a second set of crack stopping structures 944, a third set of crack stopping structures 946, and a third set of crack stopping structures 948) that partially surround (e.g., ¾ circle) a bump area. In some implementations, each set of crack stopping structure is formed by the crack stopping structure 914, as described in FIG. 9A. However, different implementations may use any of the crack stopping structures described in the present disclosure. The crack stopping structure is positioned to be between the bump area and a center of the semiconductor device (e.g., die). In some implementations, the set of crack stopping structures help prevent cracks from propagating towards the center of the die and nearby bump areas. It should be noted that the set of crack stopping structures may have other shapes as well (e.g., oval, rectangular), and it not limited by the examples shown in FIGS. 9A-9C.

Figure 10A:
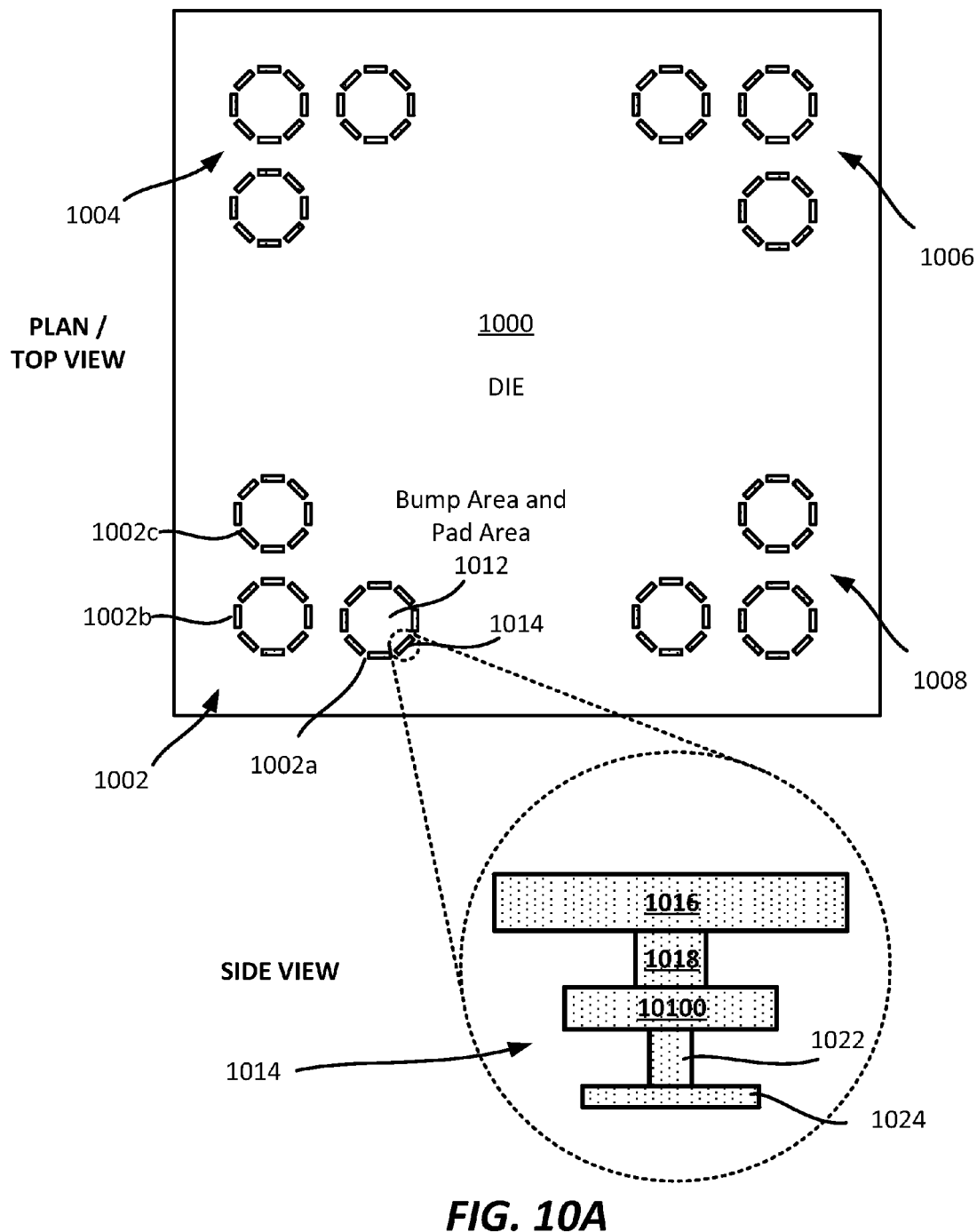
FIG. 10A illustrates an example of a die that includes a crack stopping structure.
Figure 10B:
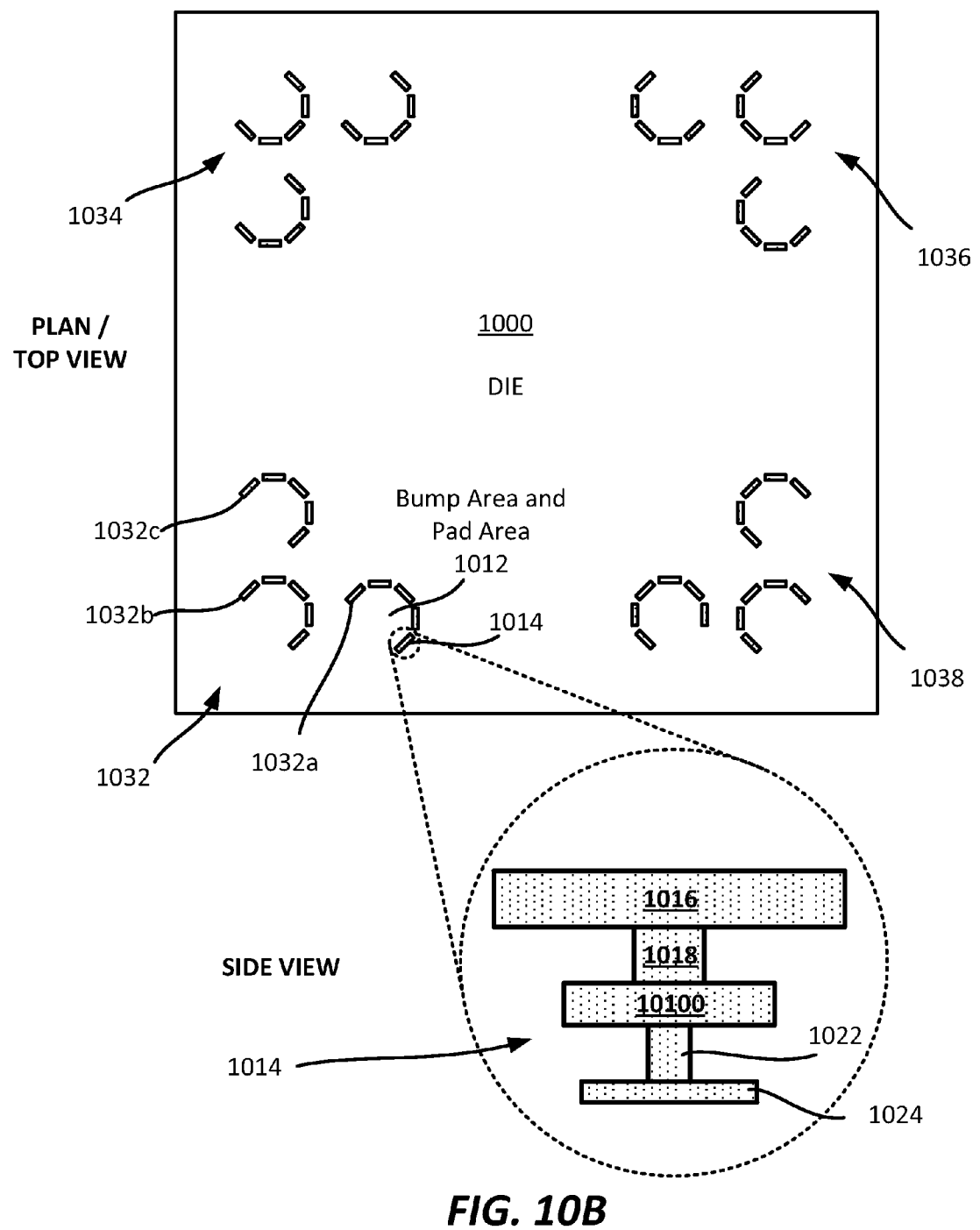
FIG. 10B illustrates an example of a die that includes a crack stopping structure.
Figure 10C:
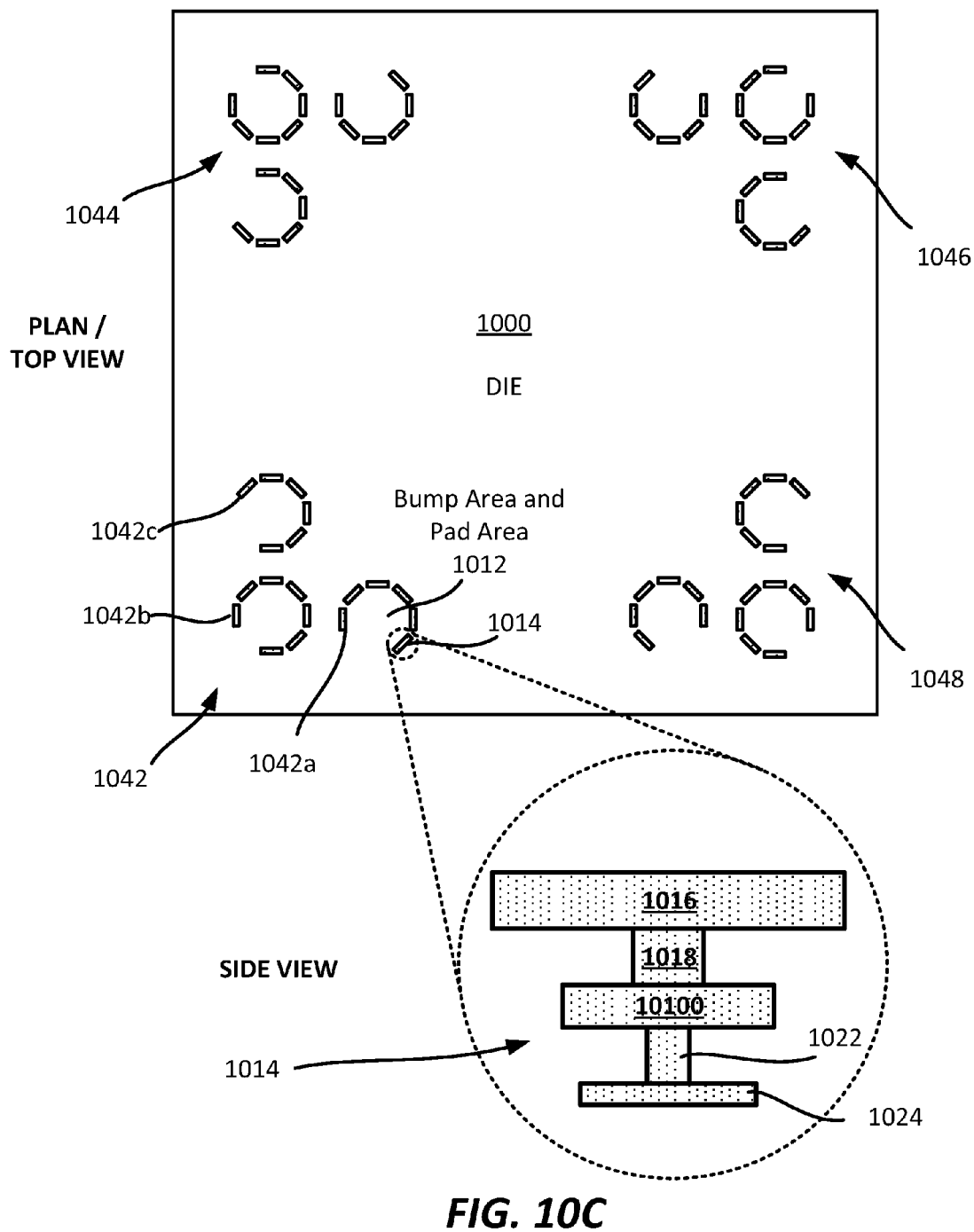
FIG. 10C illustrates an example of a die that includes a crack stopping structure.

In some implementations, the crack stopping structure is configured in such a way as to surround a bump area and a pad area of a semiconductor device. FIG. 10A-10C illustrate a semiconductor device that includes several crack stopping structures that surround (e.g., completely surround, partially surround) a bump area and a pad area of the semiconductor device.

Specifically, FIG. 10A illustrates a semiconductor device 1000 (e.g., die, wafer) that includes a first set of crack stopping structure 1002, a second set of crack stopping structures 1004, a third set of crack stopping structures 1006, and a third set of crack stopping structures 1008. As shown in FIG. 10A, the set of crack stopping structures 1002-1008 are positioned near the corners of the semiconductor device 1000 (e.g., die).

As shown in FIG. 10A, the first set of crack stopping structures 1002 includes three crack stopping structures, including a first crack stopping structure 1002a, a second crack stopping structure 1002b, and a third crack stopping structure 1002c. The crack stopping structure 1002a is formed by several crack stopping structures.

In some implementations, the crack stopping structure 1002a is configured in such a way as to surround the area 1012 of the semiconductor device 1000 (e.g., die). In some implementations, the area 1012 is a bump and pad area of the semiconductor device. In some implementations, the area 1012 includes a bump area of the semiconductor device (e.g., die) near the corner, where a solder (not shown) is going to be coupled to the semiconductor device (e.g., during a bonding process that couples the die to a package substrate). In some implementations, the area 1012 includes the bump area 430 of FIG. 4. In some implementations, the area 1012 includes a pad area of the semiconductor device (e.g., die) that includes a pad that is coupled to a lower level metal layer of the semiconductor device. In some implementations, the area 1012 includes the pad area 432 of FIG. 4.

As further shown in FIG. 10A, the crack stopping structure 1002a is formed by several structures (e.g., structure 1014) that surround the bump and pad area 1012. These structures (e.g., structure 1014) may also be referred to as crack stopping structures. Each structure is formed by one or more metal layers and one or more vias integrated and/or implemented in the lower level metal and dielectric layers (e.g., lower level metal and dielectric layers 402) of the semiconductor device (e.g., semiconductor device 400). For example, the structure 1014 includes a first metal layer 1016, a first via 1018, a second metal layer 1020, a second via 1022, and a third metal layer 1024. In some implementations, the structure 1014 of FIG. 10A is the same as the crack stopping structure 308 of FIG. 3. However, the structure 1014 may be any of the crack stopping structures described in the present disclosure (e.g., crack stopping structures 420, 500, 600, 700, 800). In some implementations, the crack stopping structure may includes combinations of different types of crack stopping structures (e.g., (e.g., crack stopping structure 500 and crack stopping structure 600).

As described above, crack stopping structures are configured in the semiconductor device (e.g., die) in such a way as to surround (e.g., completely surround, partially surround) one or more bump areas and pad areas of the semiconductor device (e.g., area of the die where a solder ball is going to be coupled to the die). In some implementations, the crack stopping structures are configured in the semiconductor device in such a way as to partially surround one or more bumps areas and pad areas of the semiconductor device.

FIGS. 10B and 10C illustrate plan view (e.g., top view) and a side of several crack stopping structures in a semiconductor device (e.g., die). FIG. 10B illustrates a semiconductor device 1000 (e.g., die, wafer) that includes a first set of crack stopping structure 1032, a second set of crack stopping structures 1034, a third set of crack stopping structures 1036, and a third set of crack stopping structures 1038. Specifically, FIG. 10B illustrates crack stopping structures (e.g., a first set of crack stopping structure 1032, a second set of crack stopping structures 1034, a third set of crack stopping structures 1036, and a third set of crack stopping structures 1038) that partially surround (e.g., half circle) a bump and pad area. In some implementations, each set of crack stopping structure is formed by the crack stopping structure 1014, as described in FIG. 10A. However, different implementations may use any of the crack stopping structures described in the present disclosure. The crack stopping structure is positioned to be between the bump and pad area, and a center of the semiconductor device (e.g., die). In some implementations, the crack stopping structure helps prevents cracks from propagating towards the center of the die.

FIG. 10C illustrates a semiconductor device 1000 (e.g., die, wafer) that includes a first set of crack stopping structure 1042, a second set of crack stopping structures 1044, a third set of crack stopping structures 1046, and a third set of crack stopping structures 1048. FIG. 10C illustrates crack stopping structures (e.g. a first set of crack stopping structure 1042, a second set of crack stopping structures 1044, a third set of crack stopping structures 1046, and a third set of crack stopping structures 1048) that partially surround (e.g., ¾ circle) a bump and pad area. In some implementations, each set of crack stopping structure is formed by the crack stopping structure 1014, as described in FIG. 10A. However, different implementations may use any of the crack stopping structures described in the present disclosure. The crack stopping structure is positioned to be between the bump and pad area, and a center of the semiconductor device (e.g., die). In some implementations, the set of crack stopping structures help prevent cracks from propagating towards the center of the die and nearby bump and pad areas. It should be noted that the set of crack stopping structures may have other shapes as well (e.g., oval, rectangular), and it not limited by the examples shown in FIGS. 10A-10C.

FIGS. 9A-9C and 10A-10C illustrate that the areas 912 and/or 1012 (bump area, bump and pad area) have a circular shape. However, in some implementations, the areas 912 and/or 1012 may have different shapes (e.g., oval, rectangular, square).

It should be noted that FIGS. 3-4 and 9-10 illustrate an example of a semiconductor device (e.g., die) that includes one or more crack stopping structure. In some implementations, a semiconductor device may include a wafer, a die, a die package, an integrated circuit (IC), and/or an interposer. In some implementations, the interposer may be an active interposer that includes active circuit elements. Thus, the crack stopping structure is configured to provide crack stopping protection in FIGS. 3-4 and 9-10, may also be used in other types of semiconductor devices, and is not limited to wafers and dies.

Having described a wafer that can be cut into a die that includes one or more crack stopping structure, a sequence for providing/manufacturing such a crack stopping structure will now be described below.

Exemplary Sequence for Providing/Manufacturing a Crack Stopping Structure

Figure 11A:
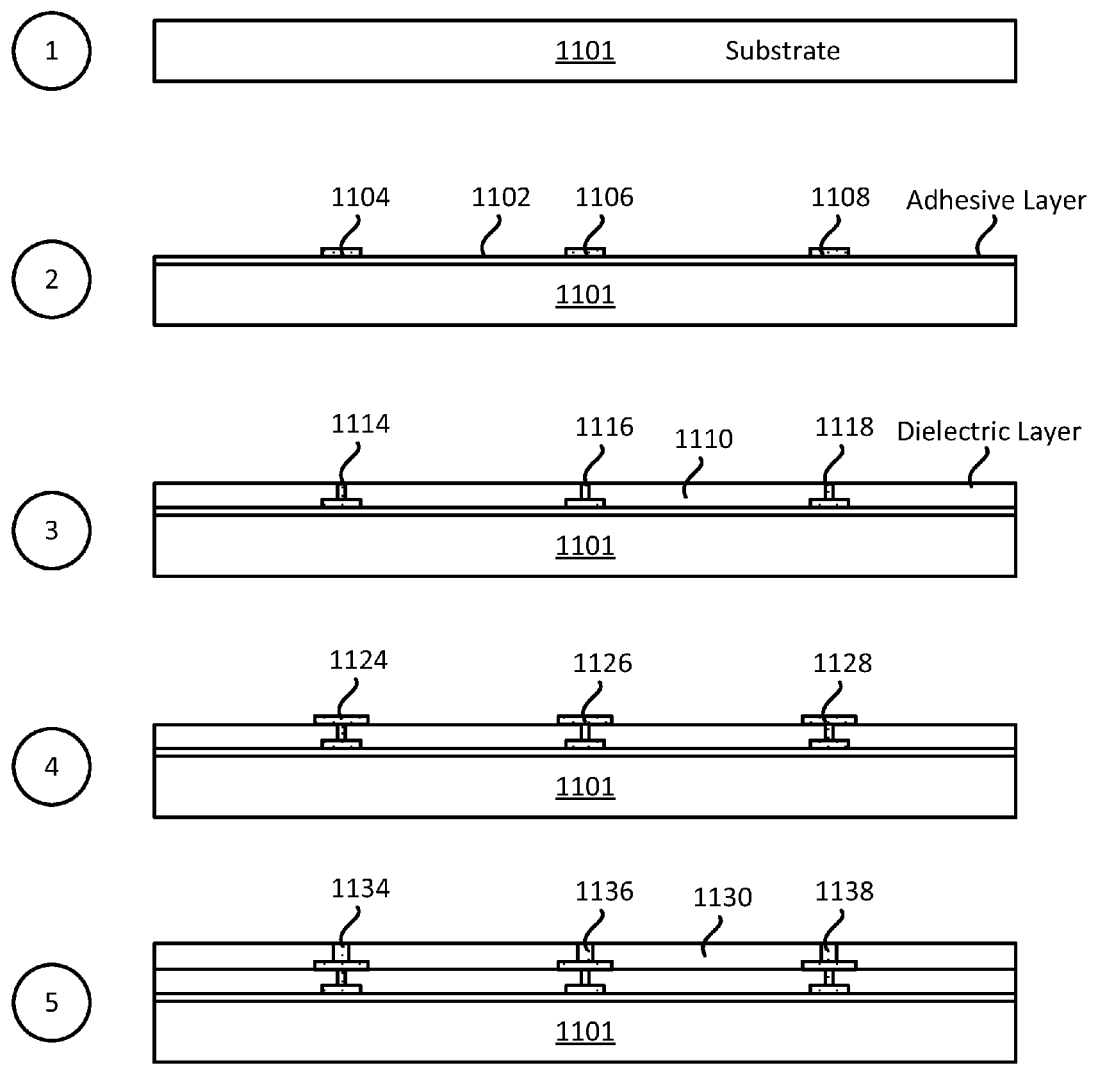
FIG. 11A illustrates part of an exemplary sequence for providing/manufacturing at least one crack stopping structure.
Figure 11B:
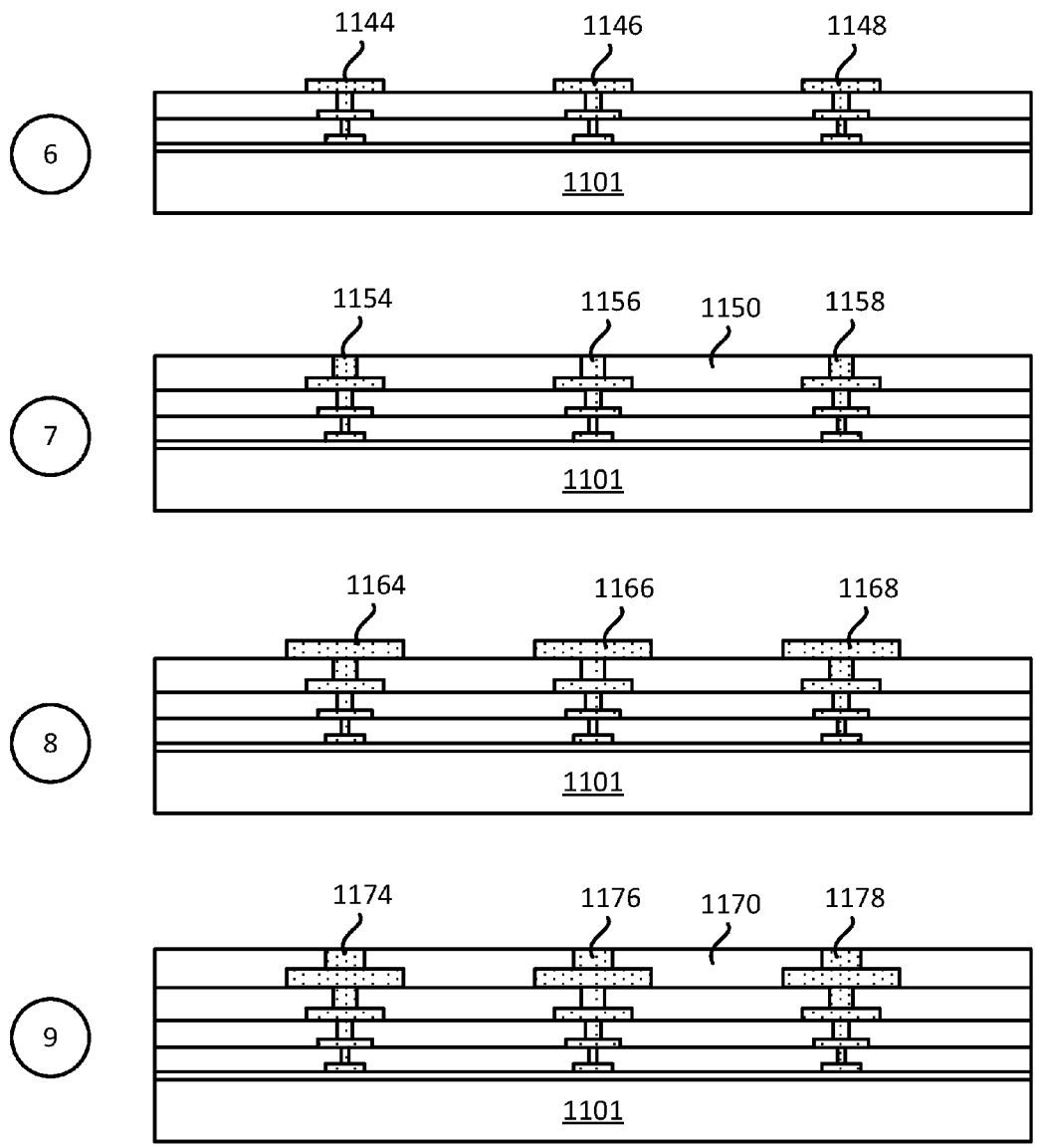
FIG. 11B illustrates part of an exemplary sequence for providing/manufacturing at least one crack stopping structure.
Figure 11C:
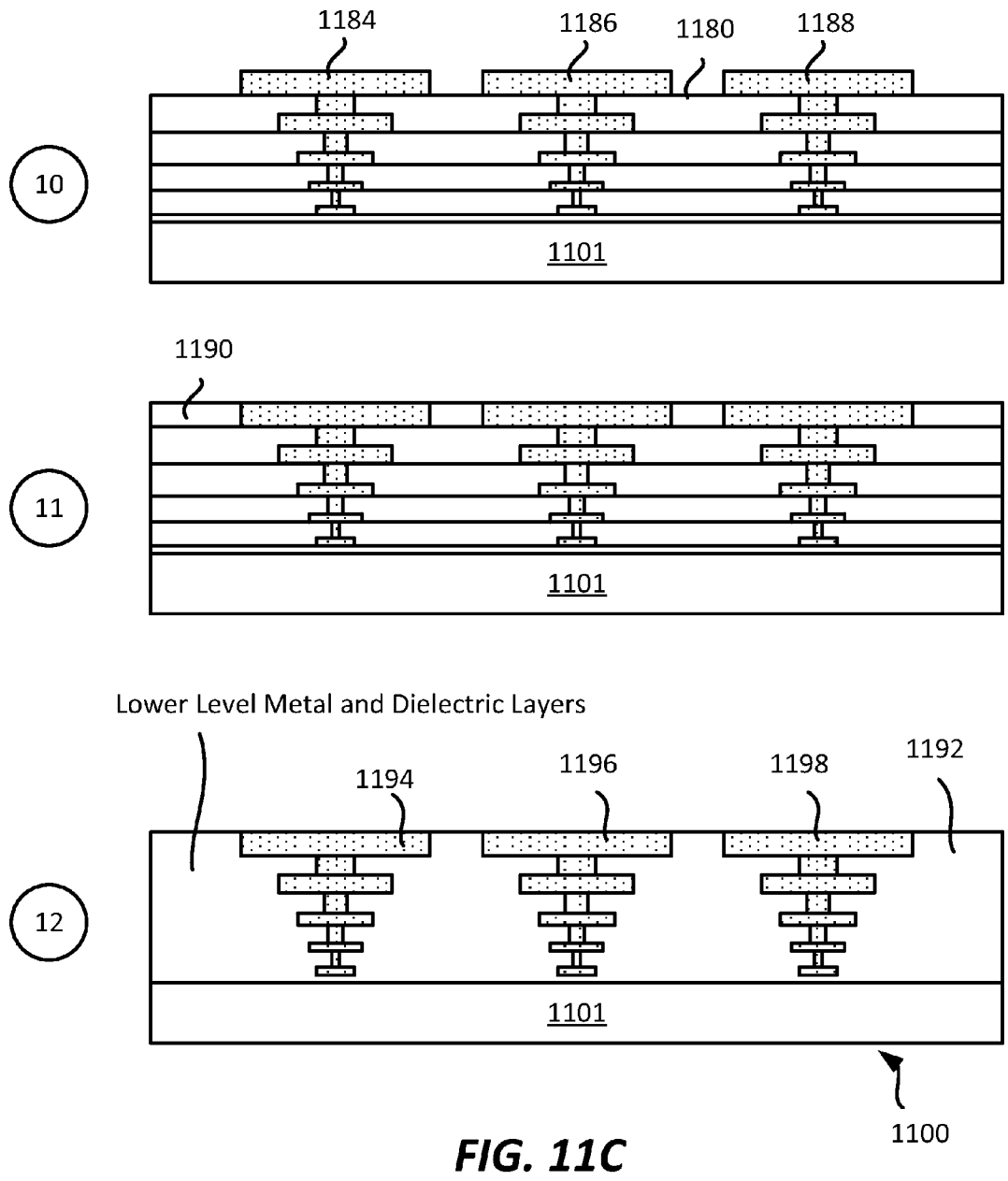
FIG. 11C illustrates part of an exemplary sequence for providing/manufacturing at least one crack stopping structure.

FIGS. 11A-11C illustrate an exemplary sequence for providing a crack stopping structure. In some implementations, the sequence of FIGS. 11A-11C may be used to provide/manufacture the crack stopping structures of FIGS. 3-10 or other cracking stopping structures described in the present disclose.

As shown in stage 1 of FIG. 11A, a substrate (e.g., substrate 1101) is provided. In some implementations, the substrate is a wafer. Different implementations may use different materials for the substrate (e.g., silicon substrate, glass substrate).

At stage 2, an adhesive layer 1102 is provided and a first set of metal layers 1104, 1106, 1108 is provided. The adhesive layer 1102 is coupled to the substrate. The first set of metal layers 1104-1108 is coupled to the adhesive layer 1102. In some implementations, the first set of metal layers 1104-1108 is a copper layer. In some implementations, providing the first set of metal layers 1104-1108 includes providing a first metal layer on the adhesive layer 1102 and selectively etching the first metal layer to define the first set of metal layers 1104-1108. In some implementations, the first set of metal layers 1104-1108 is an M1 metal layer.

At stage 3, a first dielectric layer 1110 and a first set of vias 1114, 1116, 1118 are provided. In some implementations, the first dielectric layer 1110 is on the first set of metal layers 1104-1108 and the adhesive layer 1102. In some implementations, portions of the first dielectric layer 1110 are then selectively etched to create one or more cavities. In some implementations, these cavities are via cavities. In some implementations, these cavities are provided and/or created on at least a portion of the first set of metal layers 1104-1108. Once the cavities are provided, the first set of vias 1114-1118 is provided by filling the cavities with a metal material (e.g., copper in some implementations). As shown at stage 3, the first set of vias 1114-1118 is provided on the first set of metal layers 1104-1108.

At stage 4, a second set of metal layers 1124, 1126, 1128 is provided. In some implementations, the second set of metal layers 1124-1128 is a copper layer. In some implementations, providing the second set of metal layers 1124-1128 includes providing a second metal layer on the first dielectric layer 1110 and selectively etching the second metal layer to define the second set of metal layers 1124-1128. In some implementations, the second set of metal layers 1124-1128 is an M2 metal layer.

At stage 5, a second dielectric layer 1130 and a second set of vias 1134, 1136, 1138 are provided. In some implementations, the second dielectric layer 1130 is on the second set of metal layers 1124-1128 and the first dielectric layer 1110. In some implementations, portions of the second dielectric layer 1130 are then selectively etched to create one or more cavities. In some implementations, these cavities are via cavities. In some implementations, these cavities are provided and/or created on at least a portion of the second set of metal layers 1124-1128. Once the cavities are provided, the second set of vias 1134-1138 is provided by filling the cavities with a metal material (e.g., copper in some implementations). As shown at stage 5, the second set of vias 1134-1138 is provided on the second set of metal layers 1124-1128.

At stage 6 of FIG. 11B, a third set of metal layers 1144, 1146, 1148 is provided. In some implementations, the third set of metal layers 1144-1148 is a copper layer. In some implementations, providing the third set of metal layers 1144-1148 includes providing a third metal layer on the second dielectric layer 1130 and selectively etching the third metal layer to define the third set of metal layers 1144-1148. In some implementations, the third set of metal layers 1144-1148 is an M3 metal layer.

At stage 7, a third dielectric layer 1150 and a third set of vias 1154, 1156, 1158 are provided. In some implementations, the third dielectric layer 1150 is on the third set of metal layers 1144-1148 and the second dielectric layer 1130. In some implementations, portions of the third dielectric layer 1150 are then selectively etched to create one or more cavities. In some implementations, these cavities are via cavities. In some implementations, these cavities are provided and/or created on at least a portion of the third set of metal layers 1144-1148. Once the cavities are provided, the third set of vias 1154-1158 is provided by filling the cavities with a metal material (e.g., copper in some implementations). As shown at stage 7, the third set of vias 1154-1158 is provided on the third set of metal layers 1144-1148.

At stage 8, a fourth set of metal layers 1164, 1166, 1168 is provided. In some implementations, the fourth set of metal layers 1164-1168 is a copper layer. In some implementations, providing the fourth set of metal layers 1164-1168 includes providing a fourth metal layer on the third dielectric layer 1150 and selectively etching the fourth metal layer to define the fourth set of metal layers 1164-1168. In some implementations, the fourth set of metal layers 1164-1168 is an M4 metal layer.

At stage 9, a fourth dielectric layer 1170 and a fourth set of vias 1174, 1176, 1178 are provided. In some implementations, the fourth dielectric layer 1170 is on the fourth set of metal layers 1164-1168 and the third dielectric layer 1150. In some implementations, portions of the fourth dielectric layer 1170 are then selectively etched to create one or more cavities. In some implementations, these cavities are via cavities. In some implementations, these cavities are provided and/or created on at least a portion of the fourth set of metal layers 1164-1168. Once the cavities are provided, the fourth set of vias 1174-1178 is provided by filling the cavities with a metal material (e.g., copper in some implementations). As shown at stage 9, the fourth set of vias 1174-1178 is provided on the fourth set of metal layers 1164-1168.

At stage 10 of FIG. 11C, a fifth set of metal layers 1184, 1186, 1188 is provided. In some implementations, the fifth set of metal layers 1184-1188 is a copper layer. In some implementations, providing the fifth set of metal layers 1184-1188 includes providing a fifth metal layer on the fourth dielectric layer 1170 and selectively etching the fifth metal layer to define the fifth set of metal layers 1184-1188. In some implementations, the fifth set of metal layers 1184-1188 is an M5 metal layer (e.g., top metal layer).

At stage 1, a fifth dielectric layer 1190 is provided. In some implementations, the fifth dielectric layer 1190 is on the fifth set of metal layers 1184-1188 and the fourth dielectric layer 1170.

Stage 12 illustrates a simplified version of the semiconductor device 1100 of stage 11. Specifically, stage 12 illustrates a semiconductor device that includes a first crack stopping structure 1194, a second crack stopping structure 1196 and a third crack stopping structure 1198. As shown in stage 12, the first, second and third crack stopping structures 1194-1198 are implemented and/or integrated in the lower level metal and dielectric layers of the semiconductor device 1100.

In some implementations, the first crack stopping structure 1194 includes the first metal layer 1104, the first via 1114, the second metal layer 1124, the second via 1134, the third metal layer 1144, the third via 1154, the fourth metal layer 1164, the fourth via 1174 and the fifth metal layer 1184.

In some implementations, the second crack stopping structure 1196 includes the first metal layer 1106, the first via 1116, the second metal layer 1126, the second via 1136, the third metal layer 1146, the third via 1156, the fourth metal layer 1166, the fourth via 1176 and the fifth metal layer 1186.

In some implementations, the third crack stopping structure 1198 includes the first metal layer 1108, the first via 1118, the second metal layer 1128, the second via 1138, the third metal layer 1148, the third via 1158, the fourth metal layer 1168, the fourth via 1178 and the fifth metal layer 1188.

Stage 12 also illustrates lower level dielectric layer 1192. In some implementations, lower dielectric layer 1192 includes the first dielectric layer 1110, the second dielectric layer 1130, the third dielectric layer 1150, the fourth dielectric layer 1170 and the fifth dielectric layer 1190.

Having described a sequence for providing at least one crack stopping structure, a sequence for providing/manufacturing such a semiconductor device (e.g., die) that includes at least one crack stopping structure will now be described below.

Figure 12A:
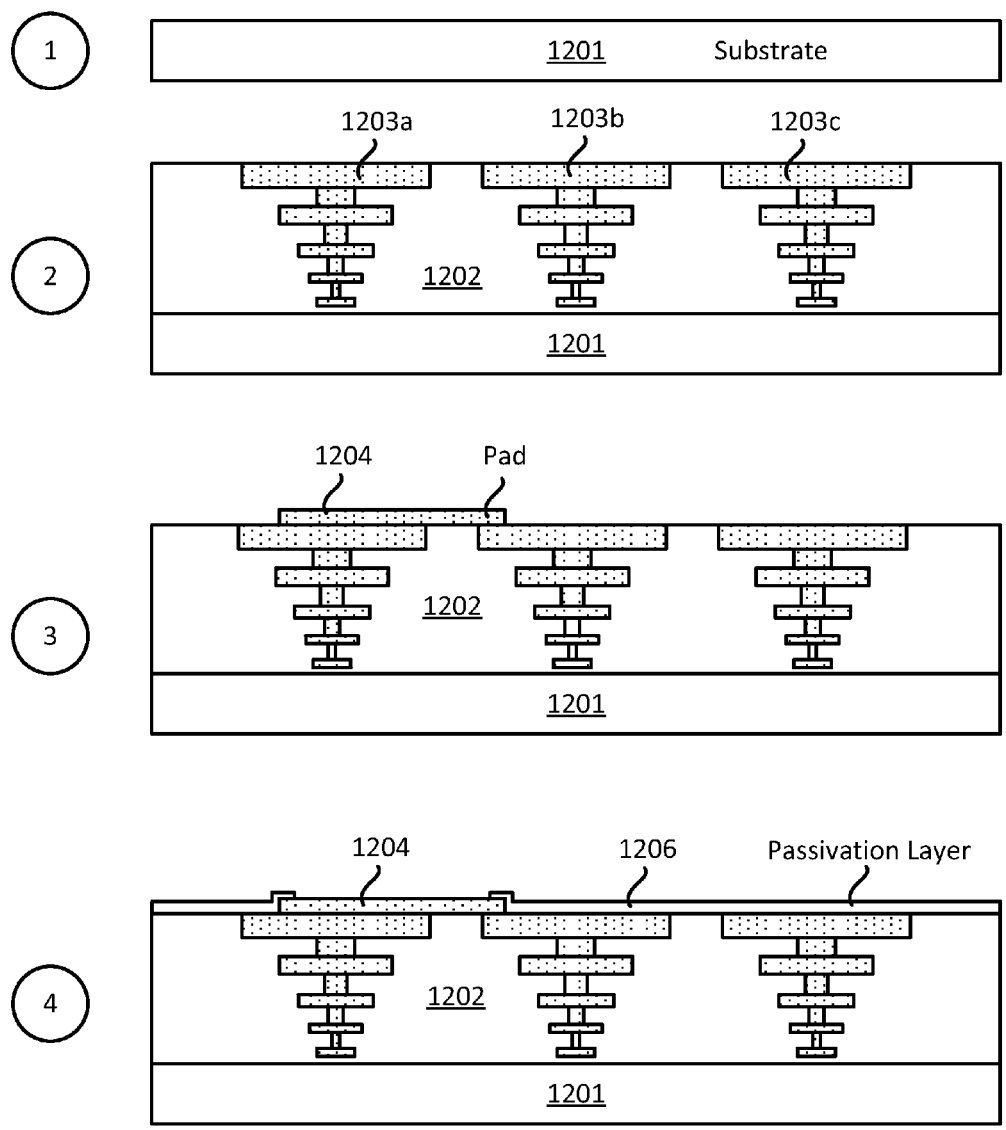
FIG. 12A illustrates part of an exemplary sequence for providing/manufacturing a die that includes at least one crack stopping structure.

Exemplary Sequence for Providing/Manufacturing a Die that Includes at Least One Crack Stopping Structure In some implementations, cutting a wafer into individual dies (e.g., single die) includes several processes. FIGS. 12A-5E illustrate an exemplary sequence for cutting a wafer into individual dies (e.g., singular dies). In some implementations, the sequence of FIGS. 12A-5E may be used to provide/manufacture the die of FIGS. 3, 4 or other dies described in the present disclose. It should also be noted that the sequence of FIGS. 12A-5E may be used to provide/manufacture other semiconductor devices (e.g., interposer). In some implementations, such a manufactured interposer may includes circuit elements.

As shown in stage 1 of FIG. 12A, a substrate (e.g., substrate 1201) is provided. In some implementations, the substrate is a wafer. Different implementations may use different materials for the substrate (e.g., silicon substrate, glass substrate).

At stage 2, several lower level metal and dielectric layers (e.g., lower level metal and dielectric layers 1202) and at least one crack stopping structure are provided on the substrate. Different implementations may provide different number of lower level metal and dielectric layers (e.g., M1 metal layer, M2 metal layer, M3 metal layer, M4 metal layer, M5 metal layer, M6 metal layer, M7 metal layer). As shown at stage 2, three crack stopping structures 1203a-1203c are provided. The crack stopping structures 1203a-1203c are implemented and/or integrated in the lower level and dielectric layers 1202. In some implementations, the crack stopping structures 1203-1203c may be any of the crack stopping structures described in the present application (e.g., crack stopping structure 420, 500, 1100). FIGS. 11A-11C illustrate an example of providing one or more crack stopping structures in a semiconductor device (e.g., die).

In some implementations, circuits, routes and/or interconnects are also provided, as such shown in FIG. 4. However, for the purpose of simplification and clarity, circuits, routes and/or interconnects are not shown.

At stage 3, at least one pad (e.g., pad 1204) is provided on the lower level metal and dielectric layers 1202. In some implementations, the pad is coupled to one of the lower level metal layer (e.g., the top lower level metal layer, M7 metal layer). In some implementations, the pad 1204 is an aluminum pad. However, different implementations may use different materials for the pad 1204. Different implementations may use different processes for providing the pad on the lower level metal and dielectric layers 1202. For example, in some implementations, a lithography and/or etching process may be use to provide the pad 1204 on the lower level metal and dielectric layers 1202.

At stage 4, a passivation layer (e.g., passivation layer 1206) is provided on the lower level metal and dielectric layers 1202. Different implementations may use different materials for the passivation layer. As shown in stage 4, the passivation layer 406 is provided on the lower level metal and dielectric layers 1202 such that at least a portion of the pad 1204 is exposed.

Figure 12B:
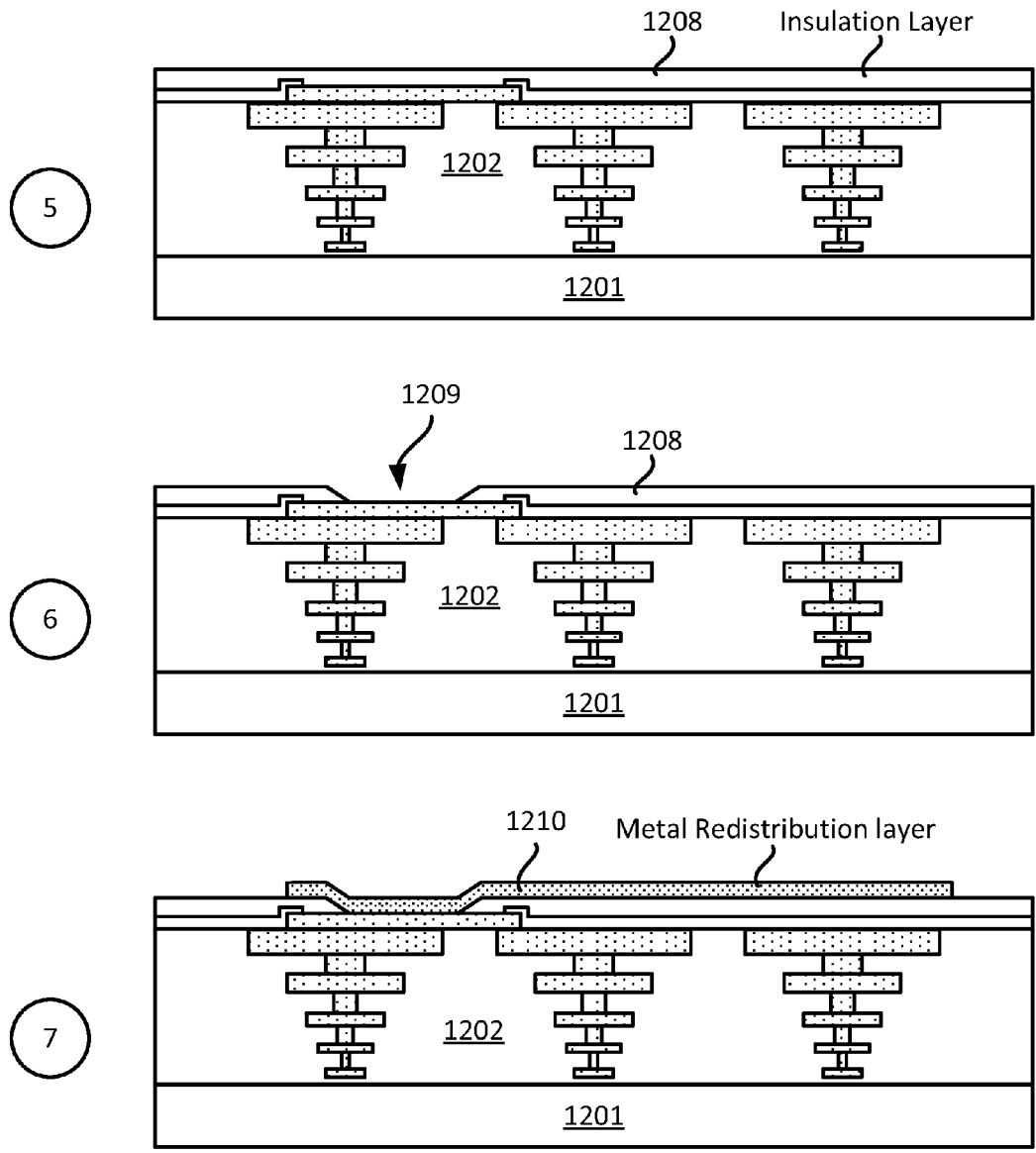
FIG. 12B illustrates part of an exemplary sequence for providing/manufacturing a die that includes at least one crack stopping structure.

At stage 5 of FIG. 12B, a first insulation layer (e.g., first insulation layer 1208) is provided on the passivation layer 1206 and the pad 1204. Different implementations may use different materials for the first insulation layer 1208. For example, the first insulation layer 1208 may be a Polybenzoxazole (PbO) layer or a polymer layer.

At stage 6, a cavity (e.g., cavity 1209) is provided/created in the first insulation layer 1208. As further shown in stage 6, the cavity 1209 is created over the pad 1204. Different implementations may create the cavity 1209 differently. For example, the cavity 1209 may be provided/created by etching the first insulation layer 1208.

At stage 7, a first metal redistribution layer is provided. Specifically, a first metal redistribution layer 1210 is provided over the pad 1204 and the first insulation layer 1208. As shown in stage 7, the first metal redistribution layer 1210 is coupled to the pad 1204. In some implementations, the first metal redistribution layer 1210 is a copper layer.

Figure 12C:
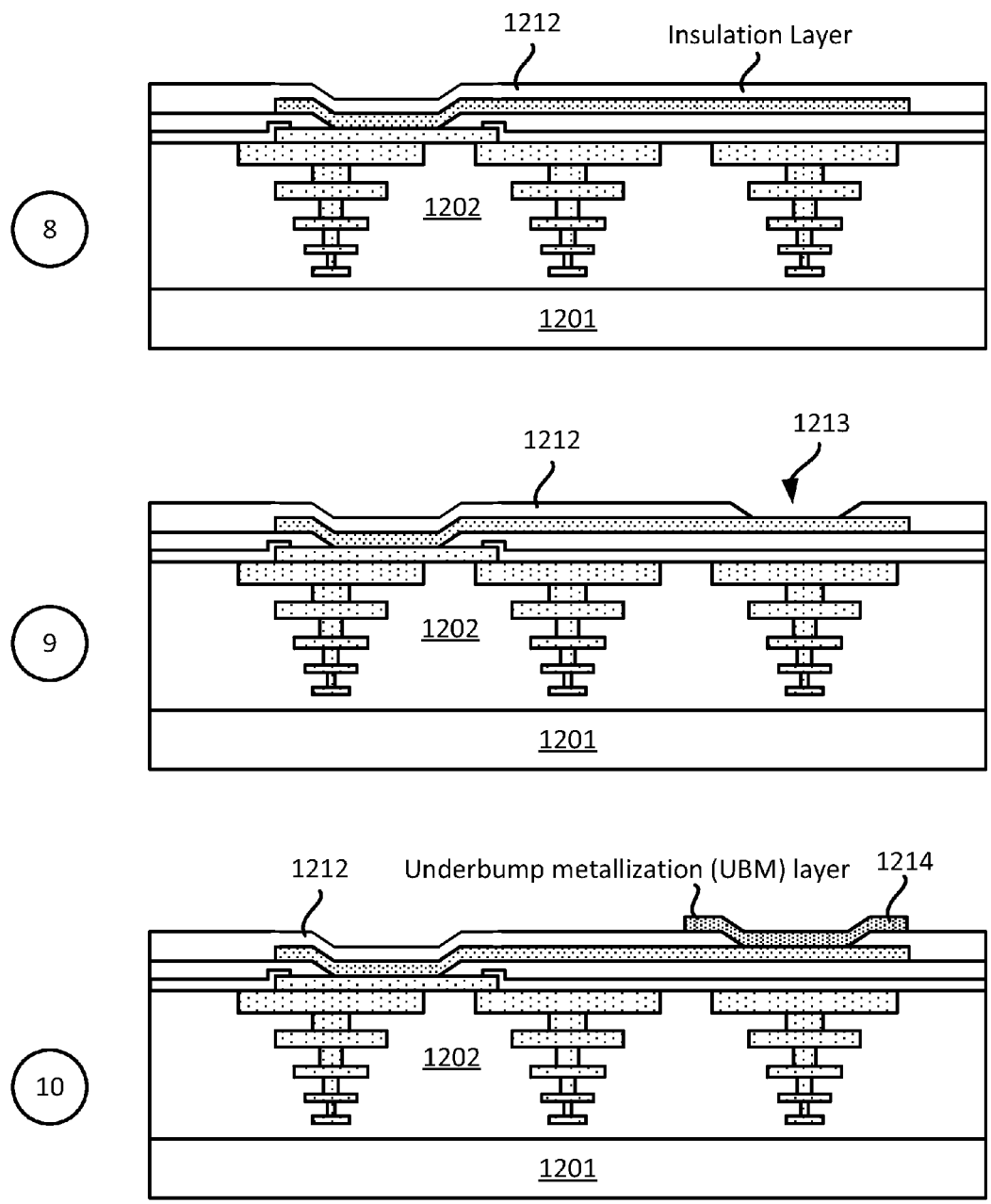
FIG. 12C illustrates part of an exemplary sequence for providing/manufacturing a die that includes at least one crack stopping structure.

At stage 8 of FIG. 12C, a second insulation layer (e.g., second insulation layer 1212) is provided on the first insulation layer 1208 and the first metal redistribution layer 1210. Different implementations may use different materials for the second insulation layer 1212. For example, the second insulation layer 1212 may be a Polybenzoxazole (PbO) layer or a polymer layer.

At stage 9, a cavity (e.g., cavity 1213) is provided/created in the second insulation layer 1212. Different implementations may create the cavity 1213 differently. For example, the cavity 1213 may be provided/created by etching the second insulation layer 1212.

At stage 10, an under bump metallization (UBM) layer is provided. Specifically, an under bump metallization (UBM) layer 1214 is provided in the cavity 1213 of the second insulation layer 1212. As shown at stage 10, the UBM layer 1214 is coupled to the first metal redistribution layer 1210. In some implementations, the UBM layer 1214 is a copper layer.

Figure 12D:
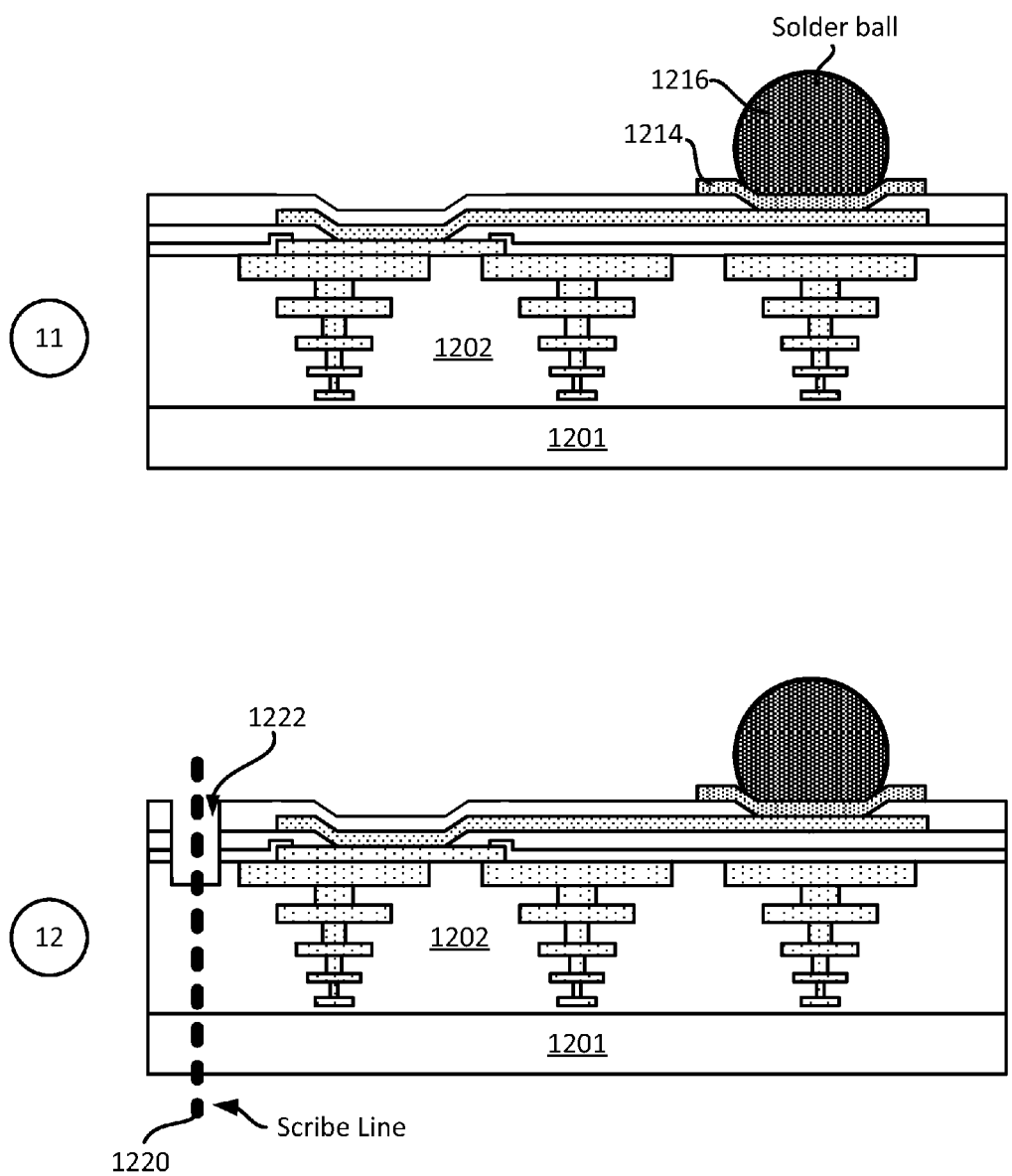
FIG. 12D illustrates part of an exemplary sequence for providing/manufacturing a die that includes at least one crack stopping structure.

At stage 11 of FIG. 12D, a solder ball is provided on the UBM layer. Specifically, a solder ball 1216 is coupled to the UBM layer 1214. As shown at stage 11, the crack stopping structures 1203a-1203c are configured, implemented and/or integrated in the lower level metal and dielectric layers 1202 in such a way as to surround the bump area of the semiconductor device and/or the pad area of the semiconductor device. In some implementations, the bump area includes the UBM layer 1214 and/or the solder ball 1216. In some implementations, the pad area includes the pad 1204.

At stage 12, a cavity is provided/created in the wafer. Specifically, a cavity 1222 is created in the second insulation layer 1212, the first insulation layer 1208, the second insulation layer 1206, and at least one of the lower level metal and dielectric layers 1202. Different implementations may have cavities and/or trenches with different shapes. As further shown in stage 12, the cavity 1222 is provided/created along a scribe line (e.g., scribe line 1220). As previously described above, a scribe line is a region of a wafer that will be cut in order to provide/manufacture one or more dies. Different implementations may use different processes for providing/creating the cavity/trench. For example, a laser may be use to create the cavity 1222. In such instances, several passes of a laser may be use to create the cavity 1222. It should also be noted that the cavity along the scribe line may traverse different parts of the wafer in different implementations. That is, in some implementations, the cavity (e.g., cavity 1222) along a scribe line may have different depths.

Figure 12E:
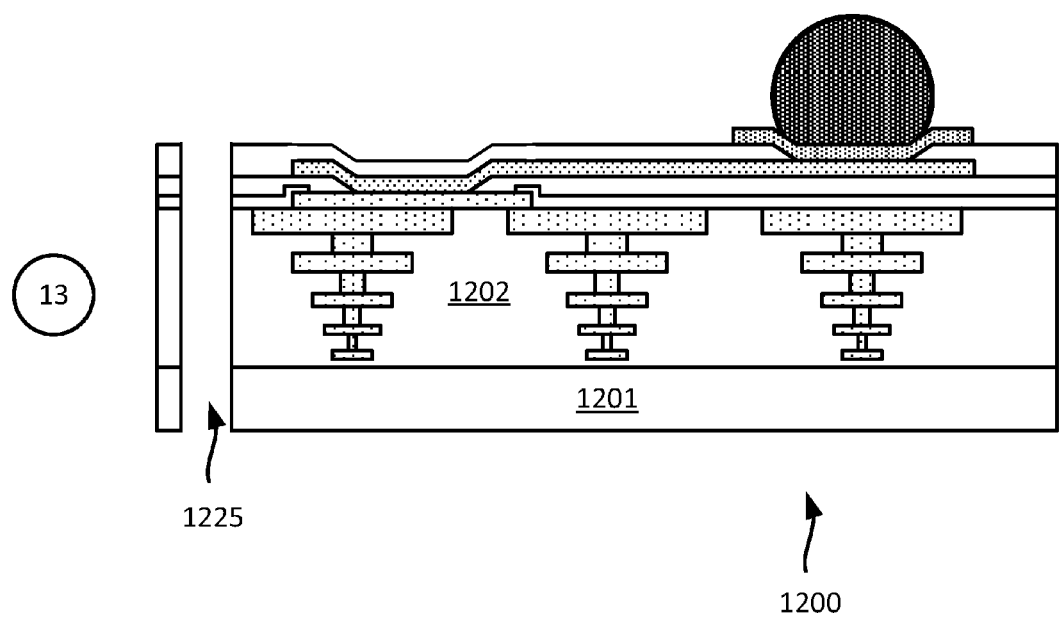
FIG. 12E illustrates part of an exemplary sequence for providing/manufacturing a die that includes at least one crack stopping structure.

At stage 13 of FIG. 12E, a saw (not shown) is used to cut the portion of the wafer along the cavity 1222 (e.g., along the scribe line 1220). In some implementations, the saw (not shown) cuts through the second insulation layer 1212, the first insulation layer 1208, the passivation layer 1206, the metal and dielectric layers 1202, and the substrate 1201, along the cavity 1222 (e.g., scribe line 1220), creating a cavity/separation 1225. In some implementations, using the saw to cut the wafer creates an individual/singular die 1200.

Figure 13:
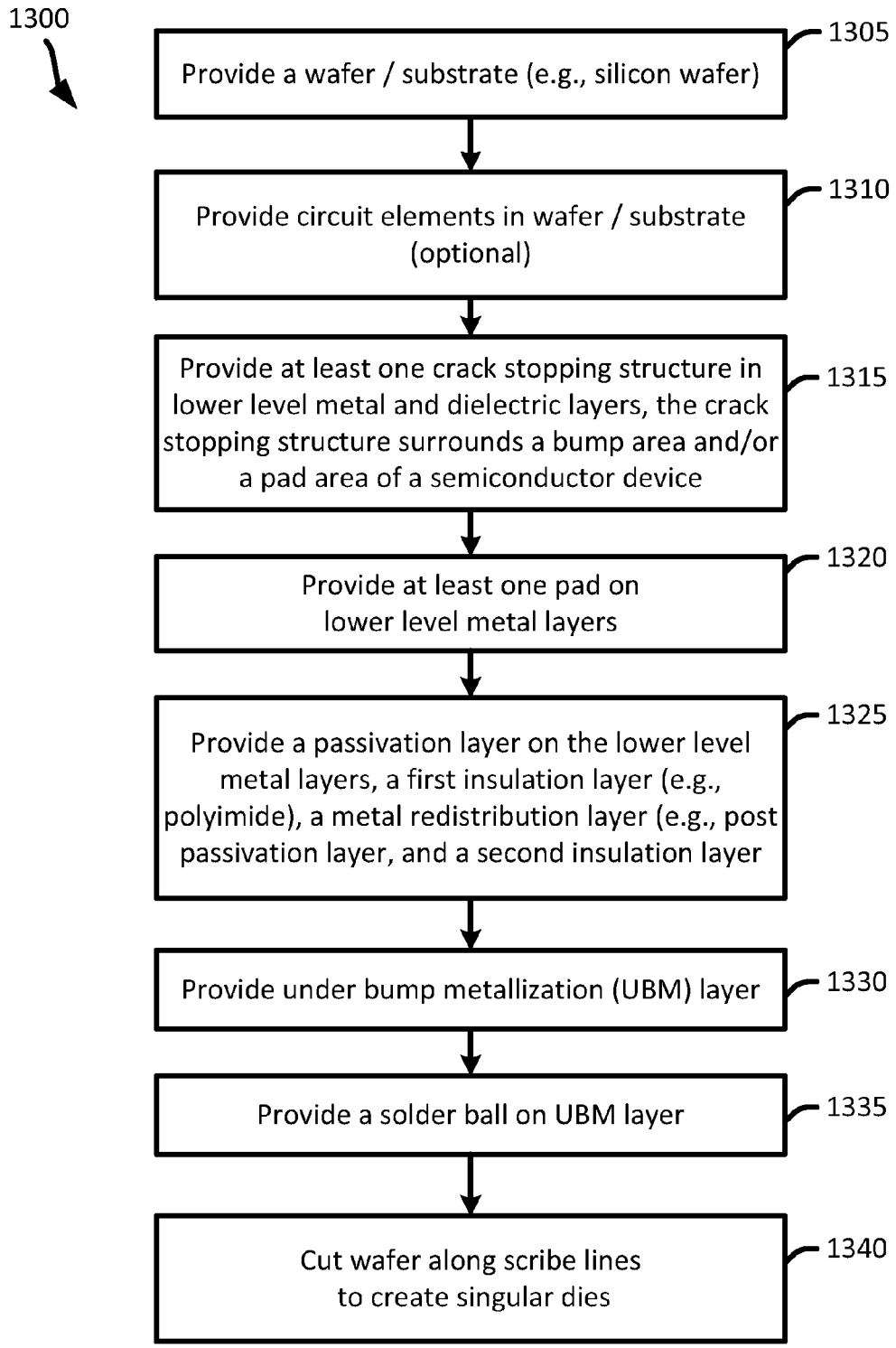
FIG. 13 illustrates an exemplary method for providing/manufacturing a die that includes at least one crack stopping structure.

Exemplary Method for Providing/Manufacturing a Semiconductor Device that Includes at Least One Crack Stopping Structure As described above, in some implementations, cutting a wafer into individual dies (e.g., single die) includes several processes. FIG. 13 illustrates an exemplary method for cutting a wafer into individual dies (e.g., singular dies). In some implementations, the method of FIG. 13 may be used to provide/manufacture the semiconductor device (e.g., die) of FIGS. 3, 4 or other semiconductor device described in the present disclose.

The method provides (at 1305) a substrate (e.g., substrate 1201). In some implementations, providing (at 1305) the substrate includes providing a wafer (e.g., silicon wafer). However, different implementations may use different materials for the substrate (e.g., glass substrate). The method then optionally provides (at 1310) circuit elements in the substrate. In some implementations, providing (at 1310) the circuit elements may be bypassed. For example, when an interposer is manufactured from a substrate/wafer, some implementations may skip providing circuit elements (e.g., skip manufacturing active circuit elements). However, it should be noted that in some implementations, an interposer may include active circuit elements.

The method then provides (at 1315) at least one crack stopping structure. In some implementations, providing the crack stopping structure includes provides a crack stopping structure in lower level metal and dielectric layers of the semiconductor device. Different implementations may provide different number and/or types of crack stopping structure (e.g., inverted pyramid crack stopping structure). In some implementations, the crack stopping structure is provide in such a way as to surround a bump area and a pad area of the semiconductor device. In some implementations, the bump area includes a under bump metallization (UBM) layer and/or a solder ball. In some implementations, a pad area includes a pad. Different implementations may also provide different number of lower level metal and dielectric layers (e.g., M1-M7 metal layers).

The method further provides (at 1320) at least one pad (e.g., pad 1204) on one of the lower level metal and dielectric layers (e.g., M7 metal layer). In some implementations, providing (at 1320) the pad includes coupling the pad to one of the lower level metal layer (e.g., the top lower level metal layer, M7 metal layer). In some implementations, the pad is an aluminum pad. However, different implementations may use different materials for the pad. In addition, different implementations may use different processes for providing the pad on the lower level metal and dielectric layers. For example, in some implementations, a lithography and/or etching process may be use to provide (at 1320) the pad on the lower level metal and dielectric layers.

The method provides (at 1325) a passivation layer (e.g., passivation layer 1206), a first insulation layer (e.g., first insulation layer 1208), a redistribution layer (e.g., redistribution layer 1210), and a second insulation layer (e.g., second insulation layer 1212). Different implementations may use different materials for the passivation layer. In some implementations, the passivation layer is provided on the lower level metal and dielectric layers such that at least a portion of the pad is exposed. In some implementations, the metal redistribution layer is provided over the pad and the first insulation layer. In some implementations, the metal redistribution layer is coupled to the pad. In some implementations, the metal redistribution layer is a copper layer.

Different implementations may use different materials for the first and second insulation layers. For example, the first and second insulation layers may be a Polybenzoxazole (PbO) layer and/or a polymer layer.

The method then provides (at 1330) an under bump metallization (UBM) layer. In some implementations, providing (at 1330) the UBM layer includes coupling the UBM layer to the metal redistribution layer. In some implementations, the UBM layer is a copper layer. The method further provides (at 1335) a solder ball on the UBM layer.

The method then cuts (at 1340) the wafer along one or more scribe line (e.g., cut the portion of the wafer). In some implementations, a saw is used to cut (at 1340) through the second insulation layer, the first insulation layer, the passivation layer, the metal and dielectric layers, and the substrate, along a scribe line 1220, creating a die.

Exemplary Electronic Devices

Figure 14:
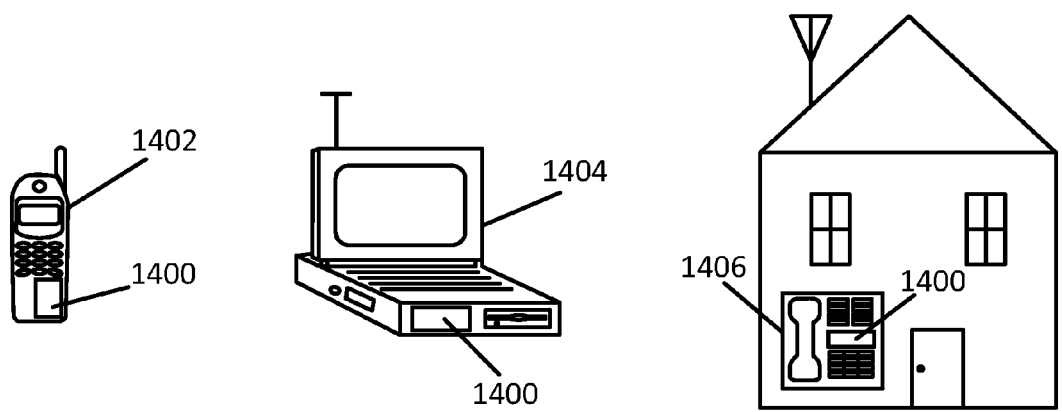
FIG. 14 illustrates various electronic devices that may integrate a semiconductor device, a die, an integrated circuit and/or PCB described herein.

FIG. 14 illustrates various electronic devices that may be integrated with any of the aforementioned semiconductor device, integrated circuit, die, interposer or package. For example, a mobile telephone 1402, a laptop computer 1404, and a fixed location terminal 1406 may include an integrated circuit (IC) 1400 as described herein. The IC 1400 may be, for example, any of the integrated circuits, dice or packages described herein. The devices 1402, 1404, 1406 illustrated in FIG. 14 are merely exemplary. Other electronic devices may also feature the IC 1400 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 3, 4, 5, 6, 7, 8, 9A-9C, 10, 11A-11C, 12A-12E, 13 and/or 14 may be rearranged and/or combined into a single component, step, feature or function or embodied in several components, steps, or functions. Additional elements, components, steps, and/or functions may also be added without departing from the invention. It should also be noted that FIGS. 3, 4, 5, 6, 7, 8, 9A-9C, 10A-10C, 11A-11C, 12A-12E, 13 and/or 14 and its corresponding description in the present disclosure is not limited to dies and/or ICs. In some implementations, 3, 4, 5, 6, 7, 8, 9A-9C, 10A-10C, 11A-11C, 12A-12E, 13 and/or 14 and its corresponding description may be used to manufacture, create, provide, produce semiconductor devices. In some a semiconductor device may include a die, a die package, an integrated circuit (IC), a wafer, and/or an interposer. In some implementations, the interposer may be an active interposer that includes circuit elements.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A semiconductor device comprising:
   a substrate;
   a plurality of metal layers and dielectric layers coupled to the substrate;
   a pad coupled to one of the plurality of metal layers;
   a first metal redistribution layer coupled to the pad;
   an under bump metallization (UBM) layer coupled to the first metal redistribution layer; and
   a plurality of crack stopping structures configured to at least partially surround a portion of the semiconductor device, wherein the portion comprises:
   a bump area comprising the UBM layer; and
   a pad area comprising the pad,
   wherein at least one crack stopping structure comprises a first metal layer and a first via,
   wherein at least one crack stopping structure is formed in at least one dielectric layer of the semiconductor device,
   wherein at least one crack stopping structure is free of an electrical connection with a circuit element of the semiconductor device, when the semiconductor device is operational.

2. The semiconductor device of claim 1, wherein the at least one crack stopping structure further includes a second metal layer, a second via, and a third metal layer.

3. The semiconductor device of claim 1, wherein the at least one crack stopping structure comprises an inverted pyramid crack stopping structure, the inverted pyramid crack stopping structure comprising:
   the first metal layer comprising a first length;
   the first via coupled to the first metal layer;
   a second metal layer coupled to the first via, the second metal layer comprising a second length that is less than the first length; and
   a second via coupled to the second metal layer,
   wherein the first metal layer, the first via, the second metal layer, and the second via are formed in at least one dielectric layer of the semiconductor device.

4. The semiconductor device of claim 1, wherein the at least one crack stopping structure completely surrounds the portion comprising the bump area and the pad area, while providing a space for one or more metal interconnects to laterally traverse the at least one crack stopping structure.

5. The semiconductor device of claim 1, wherein the at least crack stopping structure is configured to stop a crack from propagating in the semiconductor device.

6. The semiconductor device of claim 1, wherein the semiconductor device is one of at least a die, a die package, an integrated circuit (IC), a wafer, and/or an interposer.

7. The semiconductor device of claim 1, wherein the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

8. An apparatus comprising:
a substrate;
a plurality of metal layers and dielectric layers coupled to the substrate;
a pad coupled to one of the plurality of metal layers;
a first metal redistribution layer coupled to the pad;
an under bump metallization (UBM) layer coupled to the first metal redistribution layer; and
a means for stopping crack from propagating in the apparatus, the means for stopping crack configured to at least partially surround a portion of the apparatus, wherein the portion comprises:
a bump area comprising the UBM layer; and
a pad area comprising the pad,
wherein the means for stopping crack is formed in at least one dielectric layer of the apparatus,
wherein the means for stopping crack is free of an electrical connection with a circuit element of the apparatus, when the apparatus is operational.

9. The apparatus of claim 1, wherein the means for stopping crack comprises a first metal layer and a first via.

10. The apparatus of claim 8, wherein the means for stopping crack further comprises a second metal layer, a second via, and a third metal layer.

11. The apparatus of claim 1, wherein the means for stopping crack includes an inverted pyramid crack stopping structure, the inverted pyramid crack stopping structure comprising:
a first metal layer comprising a first length;
a first via coupled to the first metal layer;
a second metal layer coupled to the first via, the second metal layer comprising a second length that is less than the first length; and
a second via coupled to the second metal layer,
wherein the first metal layer, the first via, the second metal layer, and the second via are formed in at least one dielectric layer of the apparatus.

12. The apparatus of claim 1, wherein the means for stopping crack completely surrounds the portion comprising the bump area and the pad area, while providing a space for one or more metal interconnects to laterally traverse the means for stopping crack.

13. The apparatus of claim 1, wherein the apparatus is one of at least a die, a die package, an integrated circuit (IC), a wafer, and/or an interposer.

14. The apparatus of claim 1, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

15. An apparatus comprising a semiconductor device, the semiconductor device comprising:
a substrate;
a plurality of metal layers and dielectric layers coupled to the substrate;
a pad coupled to one of the plurality of metal layers;
a first metal redistribution layer coupled to the pad;
an under bump metallization (UBM) layer coupled to the first metal redistribution layer; and
a means for stopping crack from propagating in the semiconductor device, the means for stopping crack configured to at least partially surround a portion of the semiconductor device, wherein the portion comprises:
a bump area comprising the UBM layer; and
a pad area comprising the pad
wherein the means for stopping crack is formed in at least one dielectric layer of the semiconductor device,
wherein the means for stopping crack is free of an electrical connection with a circuit element of the semiconductor device, when the semiconductor device is operational.

16. The semiconductor device of claim 1, wherein the bump area comprises a first portion of the semiconductor device that is at least partially vertically aligned with the UBM layer.

17. The semiconductor device of claim 1, wherein the pad area comprises a first portion of the semiconductor device that is at least partially vertically aligned with the pad.

18. The semiconductor device of claim 1, wherein the plurality of crack stopping structures is configured to at least laterally surround the portion of the semiconductor device.

19. The apparatus of claim 8, wherein the bump area comprises a first portion of the apparatus that is at least partially vertically aligned with the UBM layer.

20. The apparatus of claim 8, wherein the pad area comprises a first portion of the apparatus that is at least partially vertically aligned with the pad.

21. The apparatus of claim 8, wherein the means for stopping crack from propagating in the apparatus is configured to at least laterally surround the portion of the apparatus.

22. The apparatus of claim 11, wherein a center of the first metal layer, a center of the first via, a center of the second metal layer, and a center of the second via are substantially vertically aligned with each other.

23. The semiconductor device of claim 3, wherein a center of the first metal layer, a center of the first via, a center of the second metal layer, and a center of the second via are substantially vertically aligned with each other.

24. The apparatus of claim 15, wherein the means for stopping crack includes an inverted pyramid crack stopping structure, the inverted pyramid crack stopping structure comprising:
a first metal layer comprising a first length;
a first via coupled to the first metal layer;
a second metal layer coupled to the first via, the second metal layer comprising a second length that is less than the first length; and
a second via coupled to the second metal layer,
wherein the first metal layer, the first via, the second metal layer, and the second via are formed in at least one dielectric layer of the semiconductor device,
wherein a center of the first metal layer, a center of the first via, a center of the second metal layer, and a center of the second via are substantially vertically aligned with each other.

* * * * *